United States Patent
Cheng

(10) Patent No.: US 7,978,024 B2
(45) Date of Patent: Jul. 12, 2011

(54) INTEGRATED BALANCED-UNBALANCED DUPLEXER

(75) Inventor: Dajun Cheng, Acton, MA (US)

(73) Assignee: Marvell International Ltd., Hamilton (BM)

( * ) Notice: Subject to any disclaimer, the term of this patent is extended or adjusted under 35 U.S.C. 154(b) by 367 days.

(21) Appl. No.: 12/049,868

(22) Filed: Mar. 17, 2008

(65) Prior Publication Data

US 2008/0224791 A1    Sep. 18, 2008

Related U.S. Application Data

(60) Provisional application No. 60/895,035, filed on Mar. 15, 2007.

(51) Int. Cl.
*H01P 5/12* (2006.01)
(52) U.S. Cl. ........... 333/126; 333/129; 333/132; 333/26
(58) Field of Classification Search .......... 333/100, 333/124–129, 132, 134, 136, 25, 26
See application file for complete search history.

(56) References Cited

U.S. PATENT DOCUMENTS

| | | | | |
|---|---|---|---|---|
| 5,742,901 | A | * | 4/1998 | Nishida .......................... 455/326 |
| 6,150,897 | A | * | 11/2000 | Nishikawa et al. ............. 333/26 |
| 7,468,640 | B2 | * | 12/2008 | Nosaka .......................... 333/26 |
| 2003/0114129 | A1 | * | 6/2003 | Jerng ............................ 455/323 |

FOREIGN PATENT DOCUMENTS

WO    WO 2005076404 A1 *  8/2005

* cited by examiner

*Primary Examiner* — Robert Pascal
*Assistant Examiner* — Kimberly E Glenn

(57) ABSTRACT

Circuitry, architectures, devices and systems for multi-band radio communications using a balanced-unbalanced duplexer. An integrated balanced-unbalanced duplexer for multi-band communications may include an unbalanced multi-band port; a first balanced single-band port; a second balanced single-band port; a first unbalanced coupling arm conductively coupled to the unbalanced multi-band port; a second unbalanced coupling arm conductively coupled to the unbalanced multi-band port; a first pair of balanced coupling arms conductively coupled to the first balanced single-band port and electromagnetically coupled to the first unbalanced coupling arm; and a second pair of balanced coupling arms conductively coupled to the second balanced single-band port and electromagnetically coupled to the second unbalanced coupling arm. The architectures and/or systems generally include components embodying one or more of the concepts disclosed herein.

28 Claims, 13 Drawing Sheets

FIG. 6A
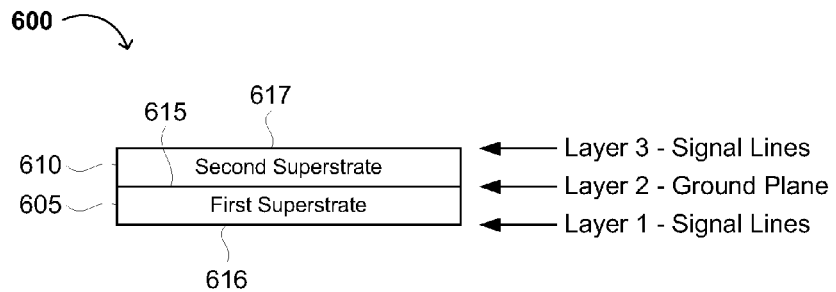
FIG. 6B
FIG. 6C
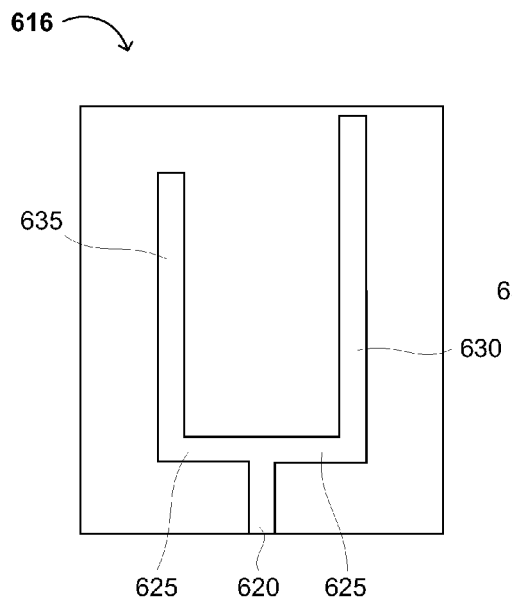
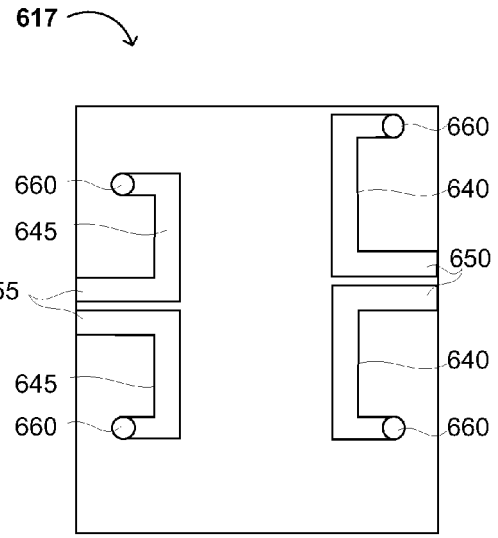

INTEGRATED BALANCED-UNBALANCED DUPLEXER

RELATED APPLICATIONS

This application claims the benefit of U.S. Provisional Application No. 60/895,035, filed Mar. 15, 2007, incorporated herein by reference in its entirety.

FIELD OF THE INVENTION

The present invention generally relates to the field of radio frequency communications. More specifically, embodiments of the present invention pertain to circuits, architectures, apparatuses and systems for multi-band radio frequency communications using a balanced-unbalanced duplexer.

DISCUSSION OF THE BACKGROUND

Multi-band radio frequency communication is common to many varieties of audio, video and/or data communication technologies, such as television, telephone, radio and data devices having RF (radio frequency) receivers and/or transmitters. Such data communication technologies may be mobile or fixed, wired or wireless, terrestrial, airborne or satellite, and/or uni-directional or bi-directional. Thus, improvements in multi-band radio frequency communication may improve many related technologies.

FIG. 1 illustrates a functional block diagram of a conventional multi-band RF front-end 100 for multi-band radio communication devices operating in the very high frequency (VHF) and ultra high frequency (UHF) radio frequency ranges. RF signals in the VHF range or meter band have frequencies from about 30 MHz to about 300 MHz and wavelengths ranging from 10 meters to 1 meter. RF signals in the UHF range or decimeter band range have frequencies from about 300 MHz to about 3 GHz with wavelengths of 10 decimeters to 1 decimeter.

RF front-end 100 comprises common or shared multi-band antenna 105, VHF filter 110, UHF filter 115, VHF low noise amplifier (LNA) 120, UHF LNA 125, VHF balun 130, UHF balun 135 and tuner 140. Shared antenna 105 is configured to receive signals in both the VHF and UHF bands. VHF filter 110 and UHF filter 115 filter out signals in frequency ranges other than the VHF and UHF ranges to output filtered VHF signal 145 and filtered UHF signal 150, respectively. VHF and UHF LNAs 120, 125 electronically amplify filtered VHF and UHF signals 145, 150 to output amplified VHF and UHF signals 155, 160, respectively.

VHF and UHF baluns 130, 135 couple VHF and UHF LNAs 120, 125 to tuner 140. VHF and UHF baluns 130, 135 are coupled to VHF and UHF LNAs 120, 125 by unbalanced singled-ended signal lines and are coupled to tuner 140 by balanced (e.g., impedance matched) differential signal lines. VHF and UHF baluns 130, 135 receive amplified VHF and UHF signals 155, 160 on unbalanced single-ended lines and output the received signals to tuner 140 as balanced VHF and UHF differential signals 165, 170. Tuner 140 selects or passes incoming VHF and UHF signals having desired frequencies for further processing (e.g., amplification, conversion, etc.) in tuner 140 and/or a downstream receiver (not shown).

RF front-end 100 duplicates LNAs 120, 125 and baluns 130, 135, even though VHF and UHF signal paths share antenna 105. Additionally, LNAs 120,125 are positioned after VHF and UHF filters 110, 115. Filters 110, 115 generally comprise surface acoustic wave (SAW) filters. Although SAW filters reliably filter out unwanted frequencies through electromechanical signal conversions, SAW filters often exhibit considerable insertion loss or signal attenuation (e.g., approximately a 3 dB loss). Additionally, splitting a received signal between shared antenna 105 and each of VHF and UHF filters 110, 115 may cause further attenuation. Attenuated signals may be problematic with respect to noise and receiver sensitivity, particularly in a high noise environment.

SUMMARY

Embodiments of the present disclosure relate to circuitry, architectures, devices and systems for multi-band radio communications using a balanced-unbalanced duplexer. In one aspect, an integrated balanced-unbalanced duplexer for multi-band communications comprises an unbalanced multi-band port; a first balanced single-band port; a second balanced single-band port; a first unbalanced coupling arm conductively coupled to the unbalanced multi-band port; a second unbalanced coupling arm conductively coupled to the unbalanced multi-band port; a first pair of balanced coupling arms conductively coupled to the first balanced single-band port and electromagnetically coupled to the first unbalanced coupling arm; and a second pair of balanced coupling arms conductively coupled to the second balanced single-band port and electromagnetically coupled to the second unbalanced coupling arm. For example, each of the first and second balanced ports may have a characteristic frequency or frequency band of signal reception and/or transmission, which generally will be different in the different ports. The architectures and/or systems generally comprise those architectures and/or systems that include a circuit embodying one or more of the inventive concepts disclosed herein.

The present embodiments advantageously improve the performance, cost, dimensions, weight, and/or signal quality of multi-band RF communication circuitry, apparatuses and systems. These and other advantages of the present invention will become readily apparent from the detailed description below.

BRIEF DESCRIPTION OF THE DRAWINGS

FIGS. 6A-6D are side and layer views of a stacked aperture coupling embodiment of the present integrated duplexer.

Like reference symbols in the various drawings indicate like elements.

DETAILED DESCRIPTION OF THE EMBODIMENTS

Figure 1:
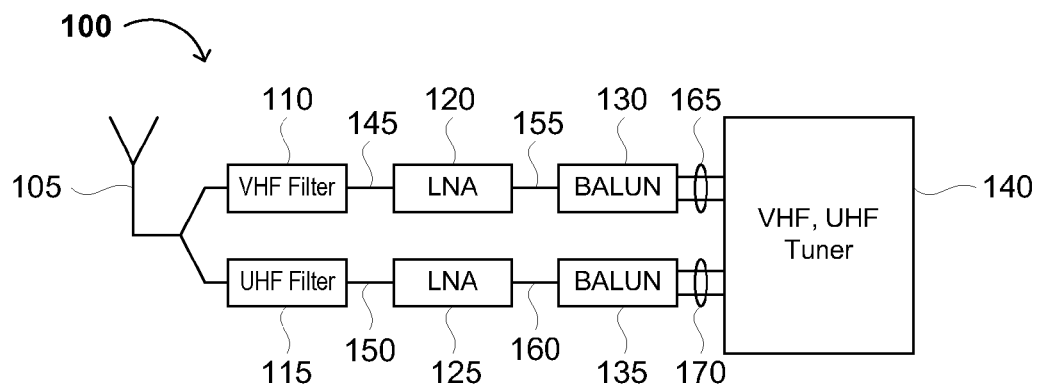
FIG. 1 is a functional block diagram showing a conventional multi-band RF front end.

Reference will now be made in detail to embodiments of the disclosure, examples of which are illustrated in the accompanying drawings. While the invention will be described in conjunction with the embodiments, the embodiments are not intended to limit the scope of the invention. On the contrary, the invention is intended to cover alternatives, modifications and equivalents that may be included within the scope of the invention as defined by the appended claims. Furthermore, in the following description, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

Some portions of the descriptions which follow are presented in terms of processes, procedures, logic blocks, functional blocks, processing, and other symbolic representations of operations on data bits, data streams or waveforms within a computer, processor, controller and/or memory. A process, procedure, logic block, function, operation, etc., is herein, and is generally, considered to be a self-consistent sequence of steps or instructions (or hardware configured to execute such steps or instructions) leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer (or computer readable medium), data processing system, or logic circuit. It has proven convenient at times, principally for reasons of common usage, to refer to these signals as bits, waves, waveforms, streams, values, elements, symbols, characters, terms, numbers, or the like.

All of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings. For example, the term "electrically coupled" (and grammatical equivalents thereof) may refer to electrical and/or electromagnetic coupling, including but not limited to conductive coupling, capacitive coupling and inductive coupling.

The term "multi-band" may be used interchangeably with the term "multiple frequency bands," either of which refers to a plurality of different frequency bands and/or a plurality of different frequencies or frequency ranges within one or more frequency bands. As such, a "single band" may comprise a range of frequencies within one frequency band or portions of two or more frequency bands. Such frequency bands may be standardized and/or otherwise well-known or well-defined. The term "coupling arm" refers to any conductive path including, but not limited to, a wire or trace. The term "front-end" refers to circuitry or components associated with RF antennas, receivers, transmitters and/or transceivers. The term "duplexer" refers to a circuit or one or more circuit elements capable of simultaneous bi-directional communication as well as simultaneous uni-directional communication of signals in a plurality of frequency bands. The term "wavelength" refers to the electrical length of a signal at a given frequency as the signal propagates through a transmission medium having certain electrical and/or magnetic properties. The term "port" refers to any unidirectional or bidirectional input and/or output (e.g., input and/or output node) of a circuit.

The invention, including various aspects of the invention, will be explained in greater detail below with regard to exemplary embodiments. Embodiments of the present invention pertain to circuits, architectures, devices and systems for multi-band radio communications using a balanced-unbalanced duplexer.

A First Exemplary Architecture

Figure 2:
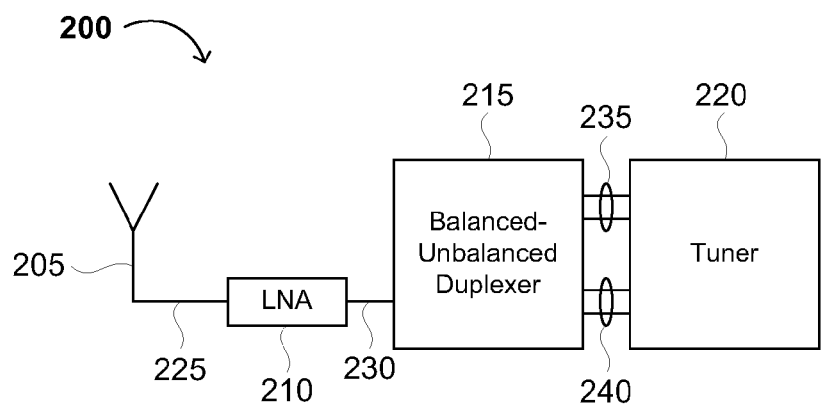
FIG. 2 is a functional block diagram showing an embodiment of the present integrated duplexer.

FIG. 2 is a functional block diagram of an exemplary RF transceiver architecture including a multi-band RF front-end 200. While an exemplary RF transceiver is shown, the inventive concepts (e.g., circuitry, designs, methodology, etc.) may be applied to signal reception, transmission and/or processing within various other bands (e.g., high frequency [HF], very high frequency [VHF], ultra high frequency [UHF], etc.). Multi-band RF front-end 200 comprises shared multi-band antenna 205, LNA 210, balanced-unbalanced duplexer 215 and tuner 220. In this embodiment, LNA 210 is directly coupled to shared antenna 205, while in other embodiments, there may be intervening components. In this embodiment, balanced-unbalanced duplexer 215 is directly coupled to LNA 210, while in other embodiments, there may be intervening components. In this embodiment, tuner 220 is directly coupled to balanced-unbalanced duplexer 215, while in other embodiments there may be intervening components.

In the embodiment shown in FIG. 2, multi-band RF front-end 200 may configured to receive signals in both the VHF and UHF bands, while in other embodiments, multi-band RF front-end 200 may be configured to transmit and/or receive RF signals in the same or other bands. Shared antenna 205 is configured to receive RF signal 225. LNA 210 electronically amplifies RF signal 225 (generally within one or more relatively wide bands or frequency ranges) and outputs amplified RF signal 230 in a plurality of bands (e.g., both the VHF and UHF bands). In the embodiment shown, balanced-unbalanced duplexer 215 receives amplified RF signal 230 on an unbalanced single-ended line. Alternatively, LNA 210 may further comprise a single ended-to-differential signal converter, and output a differential signal 230.

Balanced-unbalanced duplexer 215 selectively separates amplified RF signal 230 into separate components, typically in different bands (e.g., VHF and UHF band signals). Balanced-unbalanced duplexer 215 couples the separated signals to tuner 220 via a first balanced differential signal 235 and a second balanced differential signal 240. In one embodiment, one of the balanced differential signals 235, 240 may be a VHF signal, and the other a UHF signal. Tuner 220 selects desired frequencies from the balanced differential signals 235, 240 for further processing (e.g., amplification, conversion, etc.) by tuner 220 or components of the receiver further downstream from the tuner 220 (not shown).

By comparing the conventional multi-band RF front end shown in FIG. 1 to the exemplary architecture embodiment of the invention shown in FIG. 2, the exemplary embodiment may reduce the number of components in a multi-band communication device. In the particular embodiment shown in FIG. 2, six components have been effectively reduced to two. In some embodiments, the frequency selective characteristics of the balanced-unbalanced duplexer 215 may eliminate VHF and UHF filters 110, 115, while in other embodiments, the characteristics may relax the specified requirements for the input filters (e.g., VHF and UHF filters 110, 115). Reducing the number of components may, in turn, reduce the dimensions of the multi-band RF front end and/or multi-band communication device. Coupling LNA 210 to shared antenna 205 may provide further advantages in some embodiments, such as avoiding insertion losses resulting from splitting the signal between shared antenna 105 and VHF and UHF filters 110, 115, as well as from a pre-amplifier filter itself (e.g., VHF and/or UHF filters 110, 115). A further advantage of the exemplary embodiment shown in FIG. 2 is that the overall noise of or in the conventional architecture shown in FIG. 1 may be substantially reduced.

In some embodiments, the frequency selective characteristics of balanced-unbalanced duplexer 215 may be fixed. In other embodiments, the frequency selective characteristics of balanced-unbalanced duplexer 215 may be variable. In some embodiments, the characteristics of LNA 210 may be fixed. In other embodiments, the characteristics of LNA 210 may be variable.

While the exemplary multi-band RF front end 200 shown and discussed with reference to FIG. 2 duplexes two bands, other embodiments may multiplex more than two bands. While the embodiment discussed with reference to FIG. 2 has a shared antenna, in other embodiments there may be multiple antennas whose signals are combined on one or more common line(s) coupled to the antennas, which in turn may be configured to receive and/or transmit multiple bands.

A First Exemplary Circuit

Figure 3A:
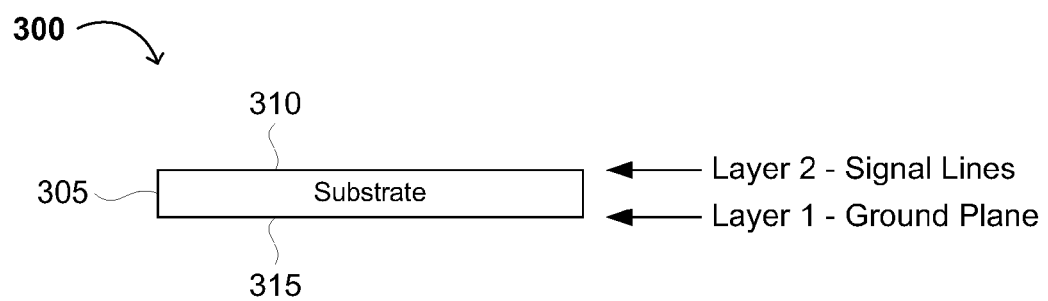
FIGS. 3A-3B are side and layer views of a lateral coupling embodiment of the present integrated duplexer.
Figure 3B:
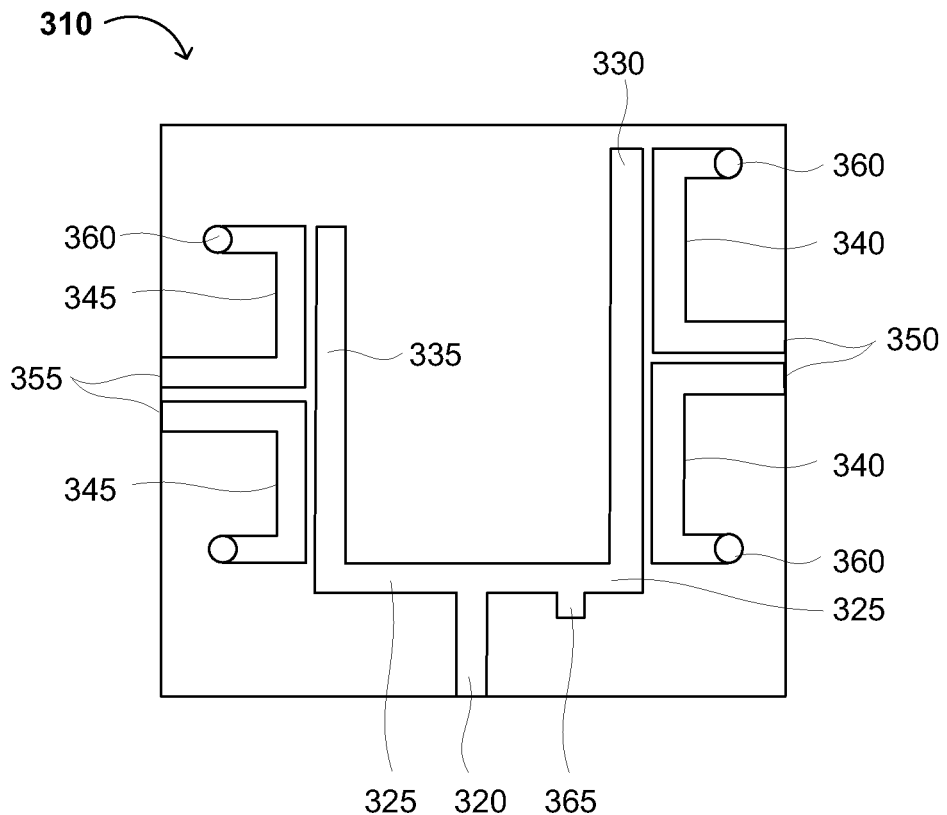

FIGS. 3A-3B illustrate one implementation of balanced-unbalanced duplexer 215 shown in FIG. 2. FIGS. 3A-3B respectively show layer and side views of a lateral coupling embodiment of the present duplexer, formed on a substrate. As suggested by lateral coupling, conductive coupling traces are formed in or on one layer. This can be seen in FIG. 3A, an exemplary side or cross-sectional view of a lateral coupling embodiment. Balanced-unbalanced duplexer 300 comprises substrate 305 having a first surface on which is formed a first layer (e.g., layer 1) and a second surface on which is formed a second layer (e.g., layer 2). In the example shown, ground plane 315 forms layer 1 while signal traces 310 form layer 2 on substrate 305. In some embodiments, ground plane 315 may comprise a solid and/or continuous conductive (e.g., metal) film, layer or surface on substantially the entire first surface of substrate 305, formed by conventional techniques (e.g., evaporation, sputtering, coating with a solution or suspension of conductive material, etc.).

FIG. 3B illustrates a top view of an exemplary lateral coupling circuit formed on layer 2 that is electrically coupled to ground plane 315 on layer 1 of substrate 305. Balanced-unbalanced duplexer 300 may comprise unbalanced single-ended port (e.g., unbalanced VHF/UHF port) 320, unbalanced signal branch 325, a first unbalanced single-ended coupling arm (e.g., unbalanced VHF coupling arm) 330, a second unbalanced single-ended UHF coupling arm (e.g., unbalanced UHF coupling arm) 335, a first pair of balanced coupling arms (e.g., balanced differential VHF coupling arms) 340, a second pair of balanced coupling arms (e.g., balanced differential UHF coupling arms) 345, a first balanced port (e.g., balanced differential VHF port) 350 and a second balanced port (e.g., balanced differential UHF port) 355. One skilled in the relevant art(s) can readily adjust the exemplary circuit design and/or circuit elements to accommodate a differential input signal.

With reference to FIGS. 2 and 3A-3B, balanced-unbalanced duplexer 215, 300 receives amplified RF signal 230 from LNA 210 through unbalanced port 230, 320. Tuner 220 receives a first balanced (e.g., differential VHF) signal 235 from balanced-unbalanced duplexer 215, 300 through a first balanced port (e.g., 350). Tuner 220 receives a second balanced (e.g., differential UHF) signal 240 from balanced-unbalanced duplexer 215, 300 through a second balanced port (e.g., 355).

Unbalanced port 320 conductively couples RF signal 230 to unbalanced signal branch 325, which conductively couples RF signal 230 to first and second unbalanced coupling arms 330, 335. The near ends of the first and second unbalanced coupling arms 330, 335 are directly connected to RF signal 230, while the far ends of first and second unbalanced coupling arms 330, 335 are open. First unbalanced coupling arm 330 is electromagnetically (and, in this embodiment, laterally) coupled to a first pair of balanced coupling arms 340. Second unbalanced coupling arm 335 is electromagnetically (and, in this embodiment, laterally) coupled to a second pair of balanced coupling arms 345. First balanced port 350 is conductively coupled to the first pair of balanced coupling arms 340. Second balanced port 355 is conductively coupled to the second pair of balanced coupling arms 345. The far ends of each arm in the first and second pairs of balanced coupling arms 340, 345 are conductively coupled to ground plane 305 through vias 360.

First and second unbalanced coupling arms 335, 340 are physically different because each resonates at a different frequency. The physical length of each of first and second unbalanced coupling arms 330, 335 may be selected to enable the coupling arms 330, 335 to self-resonate at a predetermined or desired frequency, typically about one-half of the wavelength (e.g., the length of a half-wave, or the electrical length of 180 degrees) of the center frequency or other frequency within the relevant frequency range to be detected and/or received. As half-waves, first and second unbalanced coupling arms 330, 335 effectively function as antennas over their respective frequency bands.

First and second pairs of balanced coupling arms 340, 345 are also physically different because each pair resonates at a different frequency. The physical lengths of the first and second pair of balanced coupling arms 340, 345 are selected relative to the lengths of first and second unbalanced coupling arms 330, 335. For example, in embodiments where the first and second unbalanced coupling arms 330, 335 are half-waves, the physical length of each arm in first and second pair of balanced coupling arms 340, 345 may be about equal to the length of quarter-waves of the signal to be detected and/or received.

In greater detail, in some embodiments, the lengths of first and second unbalanced coupling arms 330, 335, are approximately one-half (½) of the wavelength (i.e., λ) of the center frequency (i.e., $f_o$) of the desired portion of the respective frequency bands (e.g., VHF for coupling arm 330 and UHF for coupling arm 335). For example, in some embodiments, the relevant portion of the VHF frequency band may be from about 174 MHz to about 240 MHz with a VHF band center frequency (i.e., $f_{o(VHF)}$) of 207 MHz, while the relevant portion of the UHF frequency band may be from about 470 to about 790 MHz with a UHF band center frequency (i.e., $f_{o(UHF)}$) of 630 MHz. While the theoretical maximum wavelengths of $f_{o(VHF)}$=207 MHz and $f_{o(UHF)}$=630 MHz relative to the velocity of electromagnetic waves traveling at the speed of light in a vacuum are about 1.2 m and about 0.48 m, respectively, their wavelengths will generally be smaller due to slower wave propagation velocities across a medium such as conductive traces 330, 335. Thus, the physical length of first and second unbalanced coupling arms 330, 335, may vary from one implementation to the next in various media. References herein to wavelengths refer to effective electrical lengths based on the impedance and other properties of the transmission medium (e.g., electrical traces).

As an example of the dimensions of balanced-unbalanced duplexer 300, in an embodiment where $f_{o(VHF)}$=207 MHz and $f_{o(UHF)}$=630 MHz, substrate 305 may be approximately 12.9 square centimeters, or about two square inches, where the first and second unbalanced coupling arms 330, 335 are formed by straight conductive traces. In some embodiments, the lengths of first and second unbalanced coupling arms 330, 335 may coincide with the center frequencies of the respective bands (e.g., VHF and UHF), but in other embodiments, the lengths of first and second unbalanced coupling arms 330, 335 may coincide with frequencies other than center frequencies.

As shown in FIG. 3B, the alignment of the first and second pairs of balanced coupling arms 340, 345 relative to the first and second unbalanced coupling arms 330, 335, respectively, is substantially symmetrical, parallel and close, in order to maximize lateral electromagnetic coupling. Alignment tolerances may vary from one embodiment to the next depending on frequency bands, implementations, mediums, etc. However, in one implementation, the spacing between a pair of balanced coupling arms (e.g., 340 or 345) and a corresponding unbalanced coupling arm (e.g., 330 or 335, respectively) is as small as possible, typically less than the width of the corresponding balanced and/or unbalanced coupling arm(s). A close alignment between first and second pair of balanced coupling arms 340, 345 relative to first and second unbalanced coupling arms 330, 335 will generally result in very high coupling efficiency.

Figure 4A:
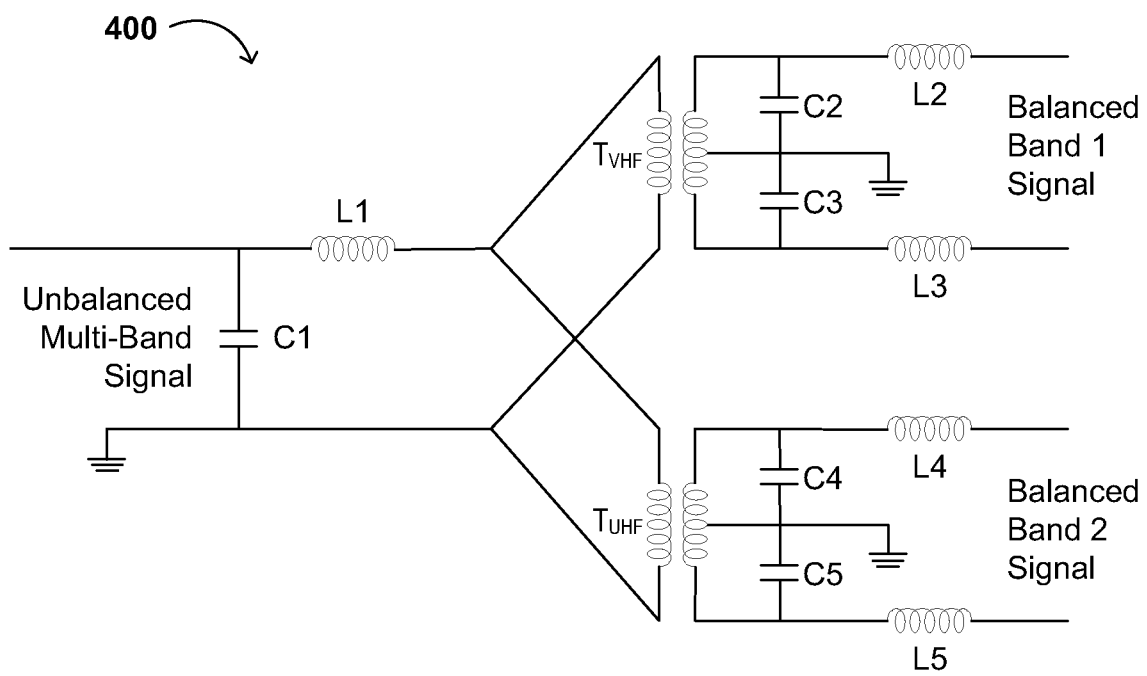
FIG. 4A is a circuit diagram of the exemplary embodiment shown in FIGS. 3A-3B.

The operation of balanced-unbalanced duplexer 300 is evident from FIG. 3B and the equivalent circuit shown in FIG. 4A. Unbalanced signal branch 325 splits amplified RF signal 230 into two paths, generally defined by first and second unbalanced coupling arms 330, 335. In one embodiment, branch 325 may be included as a component in the unbalanced coupling arms. As a result, the placement of the unbalanced port 320 may be at any location along branch 325 providing the desired and/or predetermined electrical length(s) of the unbalanced coupling arms. Because the electrical lengths of first and second unbalanced coupling arms 330, 335 are frequency dependent, the only frequencies in amplified RF signal 230 that are effectively coupled between first unbalanced coupling arm 330 and first pair of balanced coupling arms 340 and between second unbalanced coupling arm 335 and second pair of balanced coupling arms 345 are those frequencies that fall within the respective resonant frequency bands of the electrical wavelengths of the first and second unbalanced coupling arms 330, 335.

A portion of the amplified RF signal 230 will be electromagnetically coupled to each of first and second pair of balanced coupling arms 340, 345. The signals coupled to each arm of the first pair of balanced coupling arms 340 will be out of phase, as will be the signals coupled to each arm of the second pair of balanced coupling arms 345. Due to the extremely low loss of the signal path through first and second unbalanced coupling arms 330, 335, the signals coupled to each arm of the first pair of balanced coupling arms 340 should have essentially the same magnitude, as should be the case for signals coupled to each arm of the second pair of balanced coupling arms 345.

In some embodiments, the electromagnetic coupling efficiency may be improved by an impedance matching circuit (not shown), which could be incorporated into or along the unbalanced port 320. Such an impedance matching circuit may comprise, for example, a T-type or π-type circuit. As shown in FIG. 3B, in some embodiments, one or more impedance matching stubs (e.g., impedance matching stub 365) may be used in conjunction with the unbalanced signal branch 325, or elsewhere, to improve the isolation characteristics between the unbalanced port 320 and the first and second balanced ports 350, 355. For simplicity, only one impedance matching stub is shown in FIG. 3B. However, embodiments of the invention may have none, one, or more impedance matching stubs. Combined with the design (e.g., length and positioning) of unbalanced signal branch 325, impedance matching stubs may be used to exhibit an open circuit in either or both of the first and/or second unbalanced coupling arms 330, 335 when the frequency of amplified RF signal 230 does not fall within a desired frequency band. For example, frequencies in a UHF band in RF signal 230 would exhibit as an open circuit in an unbalanced single-ended VHF coupling arm (e.g., first unbalanced coupling arm 330).

In some embodiments, unbalanced port 320, first and second balanced ports 350, 355 may be unidirectional, e.g., for purposes of either transmitting or receiving, while in other embodiments, unbalanced port 320, first and second balanced ports 350, 355 may be bidirectional, e.g., for purposes of reception and transmission. In some embodiments, balanced-unbalanced duplexer 300 may couple two frequency bands, while in others one or more balanced-unbalanced duplexers may couple more than two bands. In some embodiments, balanced-unbalanced duplexer 300 may comprise passive components such as conductive traces, and in others, balanced-unbalanced duplexer 300 may comprise other passive and/or active components. In some embodiments, the frequency selective characteristics of the first and/or second unbalanced coupling arm 330, 335 may be variable through conductively coupled modification(s) of the electrical length(s) of the first and/or second unbalanced coupling arm(s) 330, 335 (not shown).

FIG. 4A is an equivalent circuit diagram of the embodiment shown in FIGS. 3A and 3B. Equivalent circuit 400 comprises first and second transformers (e.g., $T_{VHF}$ and $T_{UHF}$), capacitors C1 through C5 and inductors L1 through L5. The first transformer (e.g., $T_{VHF}$) and capacitors C2 and C3 coupled to ground represent the first unbalanced coupling arm 330 (see FIG. 3B), the first pair of unbalanced coupling arms 340 and the various electromagnetic couplings between them. Referring back to FIG. 4A, the second transformer (e.g., $T_{UHF}$) and capacitors C4 and C5 coupled to ground represent the second unbalanced coupling arm 335 (see FIG. 3B), the second pair of unbalanced coupling arms 345 and the various electromagnetic couplings between them. Referring back to FIG. 4A, the inductors L1-L5 may represent the native and/or passive inductance of the signal lines passing through the unbalanced port 320 and/or the balanced ports 350, 355 (see FIG. 3B). Alternatively, referring to FIGS. 2 and 4A, inductors L1-L5 may represent integrated or discrete inductors at the input and/or output of the unbalanced port 230 and/or the balanced ports 240, 235 from balanced-unbalanced duplexer 215.

Figure 4B:
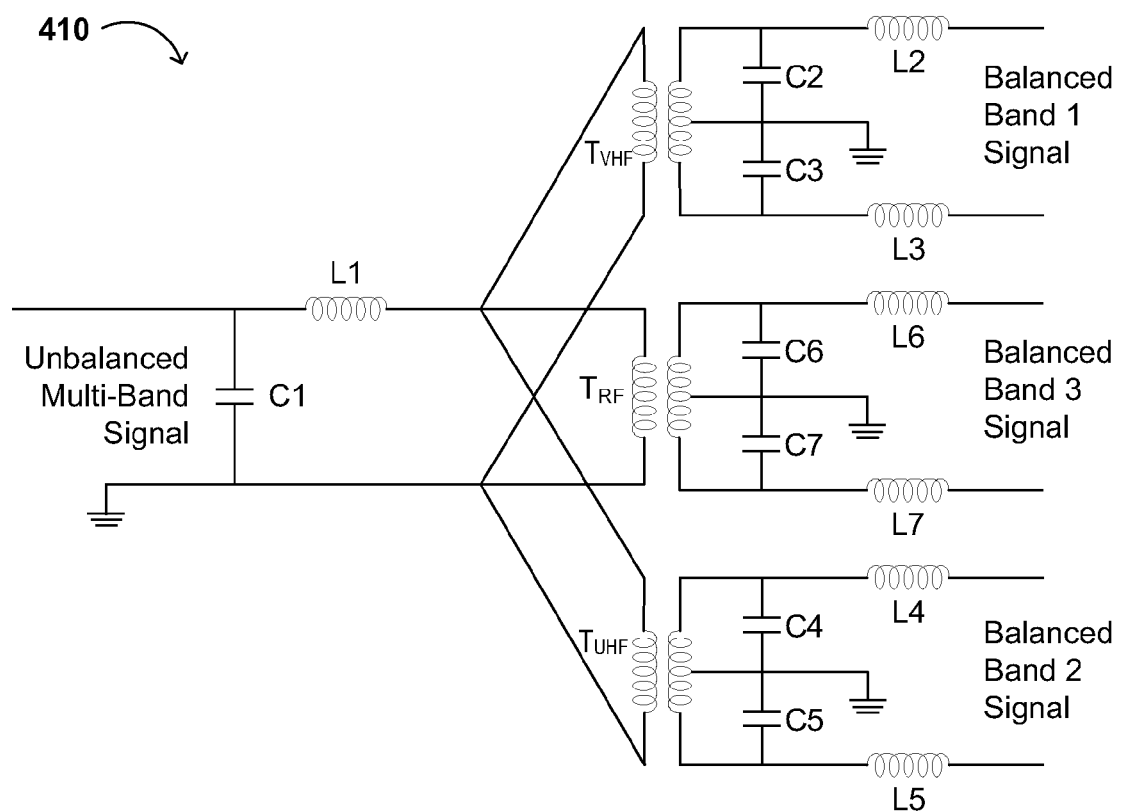
FIG. 4B is a circuit diagram of an alternative embodiment.

FIG. 4B shows a further embodiment, in which a multi-band duplexer 410 includes transformers $T_{VHF}$, $T_{UHF}$, and $T_{RF}$, capacitors C1 through C7, and inductors L1 through L7. The third transformer (e.g., $T_{RF}$) and capacitors C6 and C7 coupled to ground represent a third unbalanced coupling arm, a third pair of unbalanced coupling arms 340 and the various electromagnetic couplings between them. Thus, the multi-band duplexer 410 can comprise a third balanced single-band port, a third unbalanced coupling arm conductively coupled to the unbalanced multi-band port, and a third pair of balanced coupling arms conductively coupled to the third balanced single-band port and electromagnetically coupled to the third unbalanced coupling arm.

Figure 5A:
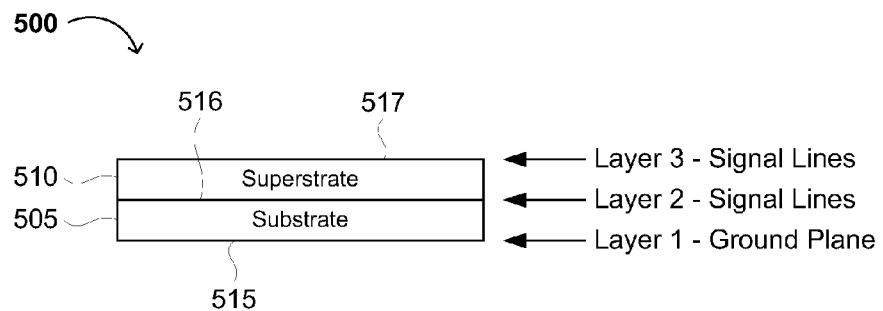
FIGS. 5A-5C are side and layer views of a stacked coupling embodiment of the present integrated duplexer.
Figures 5B, 5C:
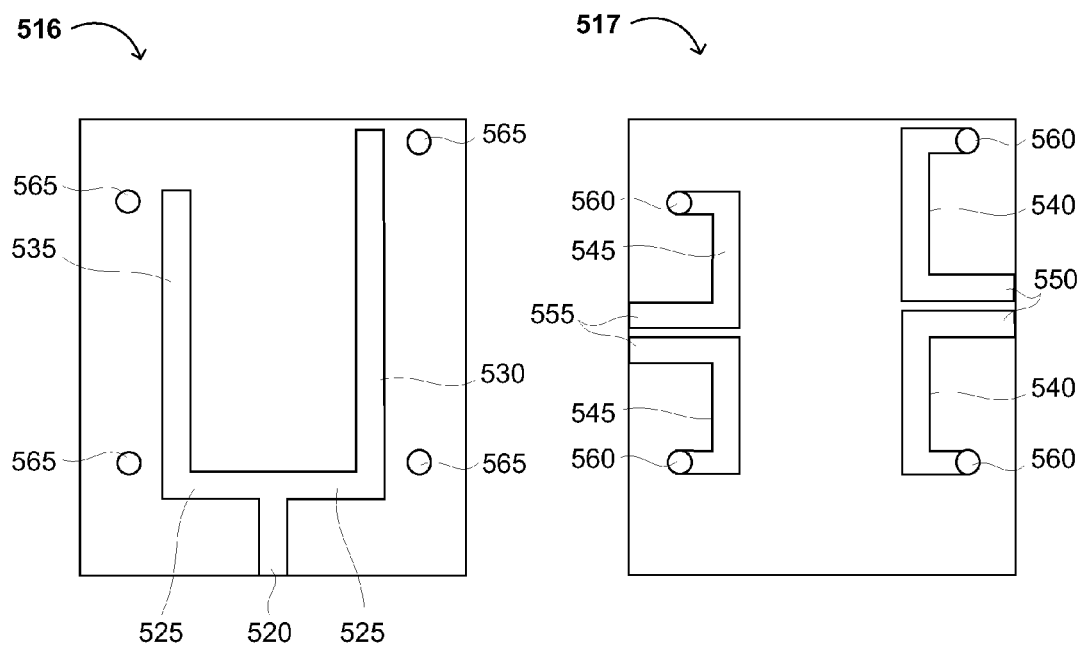

FIGS. 5A-5C illustrate another implementation of the balanced-unbalanced duplexer 215 shown in FIG. 2. FIGS. 5A-5C show side and layout views of a stacked coupling embodiment of the present duplexer. As suggested by stacked coupling, electromagnetic coupling occurs between stacked (e.g., vertically adjacent) conductive layers. This can be seen in FIG. 5A, an exemplary side view of a vertical coupling embodiment. Balanced-unbalanced duplexer 500 comprises a substrate 505 having a first surface, on which is formed a first layer (e.g., layer 1), and a second surface, on which is formed a second layer (e.g., layer 2), and a superstrate 510 having a first surface adjoining (and optionally in contact with) layer 2 and a second surface on which is formed a third layer (e.g., layer 3). Ground plane 515 may be formed from layer 1, while conductive unbalanced signal traces are formed on layer 2 and conductive balanced signal traces are formed on layer 3. In some embodiments, ground plane 515 (e.g., layer 1) may comprise a solid and/or continuous conductive (e.g., metal) film, layer or surface formed on substantially the entire first surface of substrate 505.

FIGS. 5B-5C illustrate exemplary top views of a stacked coupling embodiment formed on layers 2 and 3 that are coupled to ground plane 515 on layer 1 of substrate 515. FIG. 5B shows layer 2, on which are formed unbalanced signal traces 516, including unbalanced multiband port 520 (which may be, e.g., single-ended), unbalanced signal branch 525, first unbalanced single-ended coupling arm (e.g., unbalanced VHF coupling arm) 530, and second unbalanced single-ended coupling arm (e.g., unbalanced UHF coupling arm) 535.

FIG. 5C shows layer 3, on which are formed balanced signal traces 517 including a first pair of balanced differential coupling arms (e.g., balanced VHF coupling arms) 540, a second pair of balanced differential coupling arms (e.g., balanced UHF coupling arms) 545, a first balanced differential port (e.g., balanced VHF port) 550, and a second balanced differential port (e.g., balanced UHF port) 555. The far ends of each arm in each of the first and second pairs of balanced coupling arms 540, 545 are conductively coupled to ground plane 515 through vias 560 (which also pass through vias 565 in the substrate 505; see FIG. 5B). In some embodiments, it may be desirable to have the first and second balanced ports 550, 555 on the same layer as the unbalanced port 520, which could be accomplished using vias between signal layers 2 and 3 (not shown).

Relative to the balanced-unbalanced duplexer embodiment shown and discussed in FIGS. 3A, 3B and 4A, a primary difference in the embodiment shown in FIGS. 5A-5C is the stacked or vertical coupling, instead of lateral coupling. Thus, alignment of coupling arms and the properties and thickness of the material used to form superstrate 510 may be important to maximize electromagnetic coupling. The first pair of balanced coupling arms 540 and the first unbalanced coupling arm 530 may be positioned on layers 2 and 3, respectively, to maximize horizontal and vertical alignment and/or to be as symmetrical, parallel and close to each other as possible (within predetermined reliability tolerances). Likewise, the second pair of balanced coupling arms 545 and the second unbalanced coupling arm 535 may be similarly positioned on layers 2 and 3, respectively.

Superstrate 510 may comprise any suitable material (or laminate of suitable materials) having suitable and/or predetermined properties (e.g., thickness, dielectric constant, etc.) to maximize electromagnetic coupling between corresponding coupling arms. For example, the balanced-unbalanced duplexer 500 may be manufactured by a conventional process, including an LTCC (e.g., low temperature co-fired ceramic) process such as Dupont's GREEN TAPE™ LTCC process or other thin-film technology such as Rogers Corporation's DUROID™ laminate process. In some embodiments, the coupling efficiency of superstrate 510 may be improved by using material having a high dielectric constant such as an LTCC or DUROID™ material.

Figure 6D:
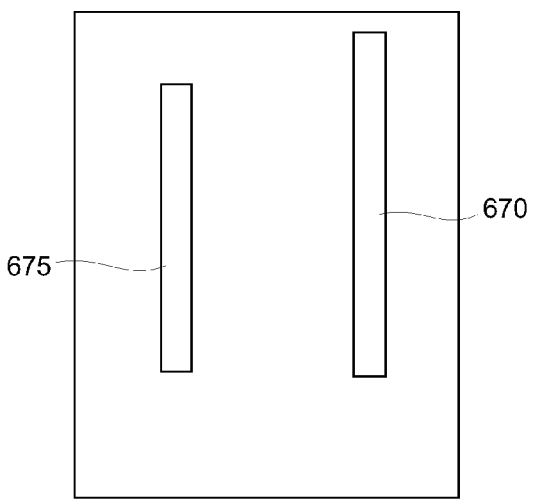

FIGS. 6A-6D illustrate a further implementation of the balanced-unbalanced duplexer 215 shown in FIG. 2. FIGS. 6A-6D show side and layout views of a stacked aperture coupling embodiment of the present duplexer. As suggested by stacked aperture coupling, electromagnetic coupling occurs between stacked (e.g., vertically adjacent) layers through one or more openings. This can be seen in FIG. 6A, an exemplary side view of a stacked aperture coupling embodiment, which may be formed on a substrate comprising first and second superstrates. The exemplary balanced-unbalanced duplexer 600 comprises first superstrate 605 having a first surface, on which is formed a first layer (e.g., layer 1), and a second surface, on which is formed a second layer (e.g., layer 2), and second superstrate 610 having a first surface adjoining and/or in contact with layer 2 and a second surface on which is formed a third layer (e.g., layer 3). Ground plane 615 is formed in layer 2 between first and second superstrates 605 and 610, while conductive unbalanced signal traces 616 are formed in layer 1 and conductive balanced signal traces 617 are formed in layer 3. In embodiments where the ground plane 615 (e.g., layer 1) comprises a solid and/or continuous conductive (e.g., metal) film, layer or surface on the second surface of first superstrate 605 (or the first surface of second superstrate 610), it could interfere with the coupling between corresponding arms in layers 1 and 3. Therefore, as shown in FIG. 6D, apertures 670 and 675 may be formed in the ground plane 615 to allow coupling between corresponding structures in layers 1 and 3.

FIGS. 6B-6D illustrate exemplary layout views of a stacked aperture coupling embodiment formed in layers 1 and 3 that are coupled to ground plane 615 in layer 2 of first superstrate 605. FIG. 6B shows layer 1, which includes an unbalanced multiband port (e.g., single-ended VHF/UHF port) 620, an unbalanced signal branch 625, a first unbalanced coupling arm (e.g., unbalanced single-ended VHF coupling arm) 630, and a second unbalanced coupling arm (e.g., unbalanced single-ended UHF coupling arm) 635.

FIG. 6C shows layer 3, which includes a first pair of balanced coupling arms (e.g., balanced differential VHF coupling arms) 640, a second pair of balanced coupling arms (e.g., balanced differential UHF coupling arms) 645, a first balanced port (e.g., balanced differential VHF port) 650, and a second balanced port (e.g., balanced differential UHF port) 655. The far ends of each arm in the first and second pair of balanced coupling arms 640, 645 are conductively coupled to ground plane 615 through vias 660. In some embodiments, it may be desirable to have the first and second balanced ports 650, 655 in the same layer as unbalanced port 620, which could be accomplished using vias through the first and second superstrates from layer 3 to layer 1 (not shown).

FIG. 6D shows layer 2, comprising ground plane 615 with first and second apertures 670, 675. First aperture 670 is aligned with the first unbalanced coupling arm 630 in layer 1 and the first pair of balanced coupling arms 640 in layer 3. Second aperture 675 is aligned with the second unbalanced coupling arm 635 in layer 1 and the second pair of balanced coupling arms 645 in layer 3. First and second apertures 670, 675 may be formed in ground plane 615 by known masking and etching processes.

Relative to the stacked coupling embodiment shown in and discussed with reference to FIGS. 5A-5C, a primary difference in the stacked aperture coupling embodiment shown in FIGS. 6A-6D is the coupling through plural superstrates 605, 610 and apertures 670, 675 in ground plane 615. Thus, the coupling arms 630, 635, 640, 645 and apertures 670, 675 may be aligned, and/or the properties and thicknesses of the material(s) of superstrates 605, 610 may be configured and/or selected, to maximize electromagnetic coupling. For example, the first unbalanced coupling arm 630, the first aperture 670 and the first pair of balanced coupling arms 640 may be positioned on layers 1, 2 and 3, respectively, so that they are horizontally and/or vertically aligned to be symmetrical, parallel and/or proximate to one another. Likewise, the second unbalanced coupling arm 635, the second aperture 675 and the second pair of balanced coupling arms 645 may be positioned on layers 1, 2 and 3, respectively, so that they are horizontally and/or vertically aligned to be symmetrical, parallel and proximate to one another.

Referring back to FIG. 6A, the first and second superstrates 605, 610 may comprise any of a number of suitable materials having suitable and/or predetermined thicknesses and properties (e.g., dielectric constant, to maximize electromagnetic coupling between coupling arms). For example, the balanced-unbalanced duplexer 600 may be manufactured by conventional process(es), including an LTCC (i.e. low temperature co-fired ceramic) process such as Dupont's GREEN TAPE™ LTCC process or other thin-film technology such as Rogers Corporation's DUROID™ laminate process. In some embodiments, the coupling efficiency of superstrate 510 may be improved by using material having a high dielectric constant such as an LTCC or DUROID™ material.

Figure 7A:
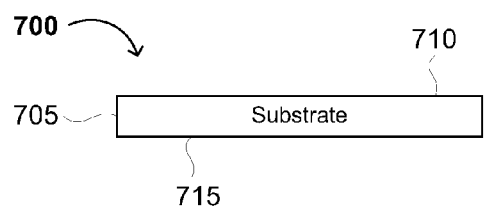
FIGS. 7A-7B are side and layer views of a compact lateral coupling embodiment of the present integrated duplexer.
Figure 7B:
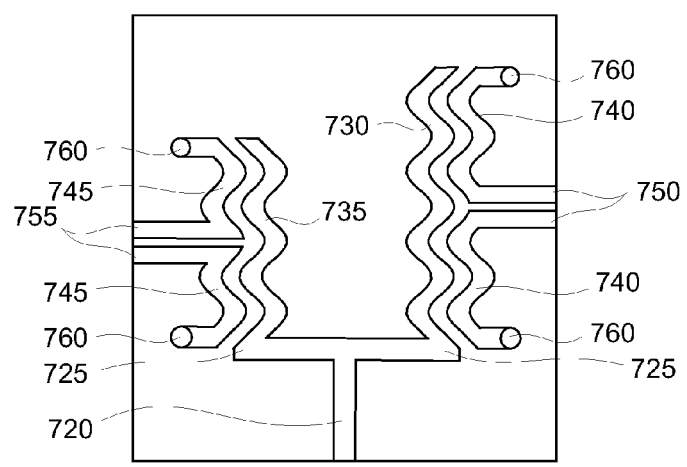

FIGS. 7A-7B illustrate yet another exemplary implementation of the balanced-unbalanced duplexer 215 shown in FIG. 2. FIGS. 7A-7B are side and layout views of a compact lateral coupling embodiment of the present invention. FIG. 7A shows an exemplary side view of a compact lateral coupling embodiment. Balanced-unbalanced duplexer 700 comprises substrate 705, in which substrate 705 comprises a first surface on which is formed a first layer (e.g., layer 1) and a second surface on which is formed a second layer (e.g., layer 2). Ground plane 715 is formed in layer 1, while signal traces 710 are formed in layer 2 on substrate 705. In some embodiments, ground plane 715 (e.g., layer 1) may comprise a solid and/or continuous conductive (e.g., metal) film, layer or surface on the entire first surface of substrate 705.

FIG. 7B illustrates an exemplary layout view (layer 2) of a compact lateral coupling embodiment. In this embodiment, layer 2 on surface 710 is coupled to ground plane 715 (layer 1) of substrate 705. The exemplary balanced-unbalanced duplexer 700 comprises an unbalanced port (e.g., unbalanced single-ended VHF/UHF port) 720, an unbalanced signal branch 725, a first unbalanced coupling arm (e.g., unbalanced single-ended VHF coupling arm) 730, a second unbalanced coupling arm (e.g., unbalanced single-ended UHF coupling arm) 735, a first pair of balanced coupling arms (e.g., balanced differential VHF coupling arms) 740, a second pair of balanced coupling arms (e.g., balanced differential UHF coupling arms) 745, a first balanced port (e.g., balanced differential VHF port) 750, and a second balanced port (e.g., balanced differential UHF port) 755.

Relative to the balanced-unbalanced duplexer embodiment shown in and discussed with reference to FIGS. 3A, 3B and 4A, a primary difference in the embodiment shown in FIGS. 7A-7B is in the shape and/or length of the compact coupling arms 730, 735, 740 and 745. The first and second unbalanced coupling arms 730, 735 and the first and second pair of balanced coupling arms 740, 745 are configured compactly in a form that provides a greater effective electrical length per unit area on the substrate 705. For example, as shown in FIG. 7B, the compact coupling arms 730, 735, 740 and 745 may be variously characterized as sinuous, wavy, S-shaped or undulating. Alternatively, the compact coupling arms 730, 735, 740 and 745 may be serpentine or comb-like (e.g., in the form of alternating and/or interlocking finger-like projections or "side arms" from a main arm). The compact configuration of coupling arms 730, 735, 740, 745 effectively reduces the dimensions of balanced-unbalanced duplexer 700. As an example of the dimensions of balanced-unbalanced duplexer 700, in an embodiment where $f_{o(VHF)}=207$ MHz and $f_{o(UHF)}=630$ MHz, substrate 705 may be approximately 6.45 square centimeters or one square inch, which is approximately 50% smaller than substrate 305 with straight coupling arms 330, 335, 340, 345.

As shown in FIG. 7B, the first pair of balanced coupling arms 740 are aligned with and/or symmetrical, parallel and/or proximate to the first unbalanced coupling arm 730 to maximize lateral electromagnetic coupling. Likewise, the second pair of balanced coupling arms 745 may be aligned with and/or symmetrical, parallel and/or proximate to the second unbalanced coupling arm 735 to maximize lateral electromagnetic coupling. Alignment tolerances may vary from one embodiment to the next depending on frequency bands, processing implementations, substrate media, etc.

Although not shown in FIGS. 7A-7B, unbalanced signal branch 725 and other traces may also be compacted, e.g., by sinuous, wavy, undulating and/or other configurations. Any conductive trace may be compacted by the above and/or other compaction techniques (such as meandering, folding, winding, spiraling, layering [e.g. spreading over multiple layers]) as long as the resulting electrical characteristics are acceptable.

Figure 8A:
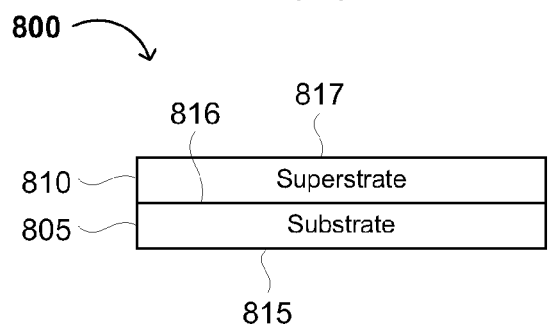
FIGS. 8A-8C are side and layer views of a compact stacked coupling embodiment of the present integrated duplexer.
Figure 8B:
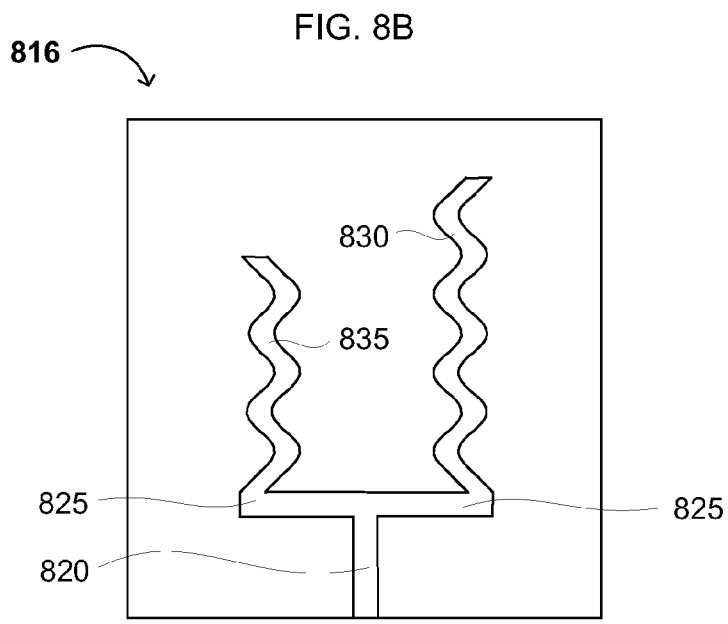
Figure 8C:
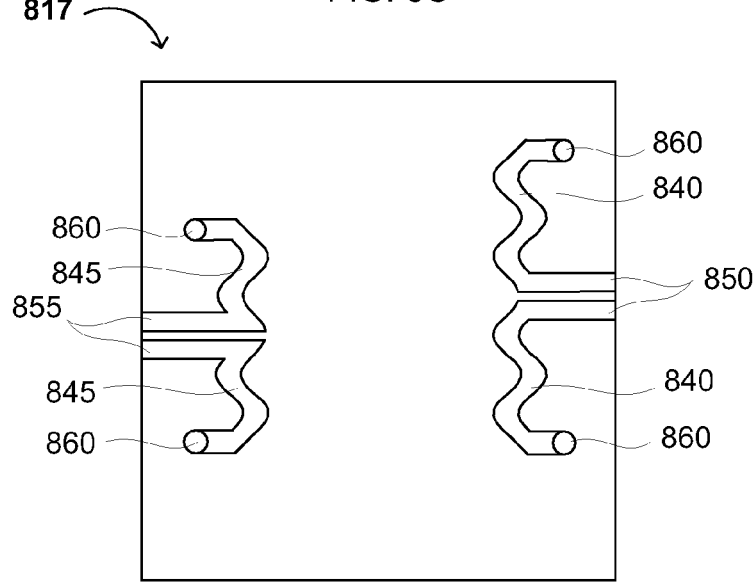

FIGS. 8A-8C illustrate a further implementation of the balanced-unbalanced duplexer 215 shown in FIG. 2. FIGS. 8A-8C are side and layout views of a compact stacked coupling embodiment of the present duplexer. FIG. 8A shows an exemplary side view of a compact stacked coupling embodiment. The balanced-unbalanced duplexer 800 comprises substrate 805 having a first surface, on which is formed a first layer (e.g., layer 1), and a second surface, on which is formed a second layer (e.g., layer 2), and a superstrate 810 having a first surface adjoining and/or in contact with layer 2 and a second surface on which is formed a third layer (e.g., layer 3). Ground plane 815 is formed in layer 1, while conductive unbalanced signal traces 816 are formed in layer 2, and conductive balanced signal traces 817 are formed in layer 3. In some embodiments, ground plane 815 (e.g., layer 1) may comprise a solid and/or continuous conductive (e.g., metal) film, layer or surface formed on substantially the entire first surface of substrate 805.

FIGS. 8B-8C illustrate exemplary layout views of a compact stacked coupling embodiment (layers 2 and 3), coupled to ground plane 815 in layer 1 of substrate 805. FIG. 8B shows layer 2, in which are formed unbalanced signal traces 816 including an unbalanced multiband port (e.g., unbalanced single-ended VHF/UHF port) 820, an unbalanced signal branch 825, a first unbalanced coupling arm (e.g., unbalanced single-ended VHF coupling arm) 830, and a second unbalanced coupling arm (e.g., unbalanced single-ended UHF coupling arm) 835.

FIG. 8C shows layer 3, in which the balanced signal traces 817 including a first pair of balanced coupling arms (e.g., balanced differential VHF coupling arms) 840, a second pair of balanced coupling arms (e.g., balanced differential UHF coupling arms) 845, a first balanced port (e.g., balanced differential VHF port) 850, and a second balanced port (e.g., balanced differential UHF port) 855 are formed. The far ends of each arm in the first and second pairs of balanced coupling arms 840, 845 are conductively coupled to the ground plane 815 through vias 860. In some embodiments, it may be desirable to have the first and second balanced ports 850, 855 in the same layer as the unbalanced port 820, which may be accomplished using vias through superstrate 810 from layer 3 to layer 2 (not shown).

Relative to the balanced-unbalanced duplexer embodiment shown and discussed in FIGS. 5A-5C, a primary difference in the embodiment shown in FIGS. 8A-8C is the compact coupling arms. First and second unbalanced coupling arms 830, 835 and first and second pair of balanced coupling arms 840, 845 are configured compactly in a form that effectively increases the electrical lengths of the balanced and unbalanced coupling arms 830, 835, 840, 845 and/or effectively reduces the dimensions of the balanced-unbalanced duplexer 800.

The first pair of balanced coupling arms 840 may be aligned with and/or symmetrical, parallel and/or proximate to the first unbalanced coupling arm 830 to maximize lateral electromagnetic coupling. Likewise, the second pair of balanced coupling arms 845 may be aligned with and/or symmetrical, parallel and/or proximate to second unbalanced coupling arm 835 to maximize lateral electromagnetic coupling. Alignment tolerances may vary from one embodiment to the next depending on frequency bands, processing implementations, signal transmission and/or substrate media, etc.

Although not shown in FIGS. 8A-8C, unbalanced signal branch 825 and other traces may also be compacted, e.g., by S-shaped or other configurations. Any conductive trace may be compacted by the above and/or other compaction techniques (such as meandering, folding, winding, spiraling, layering [e.g. spreading over multiple layers]) as long as the resulting electrical characteristics are acceptable.

Figure 9A:
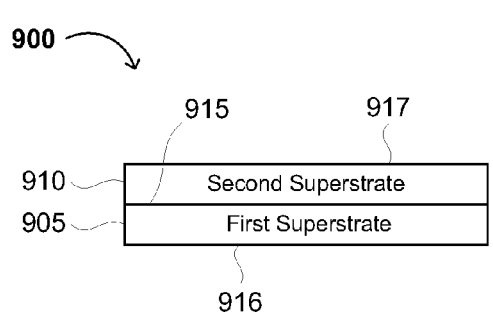
FIGS. 9A-9D are side and layer views of a compact stacked aperture coupling embodiment of the present integrated duplexer.
Figure 9B:
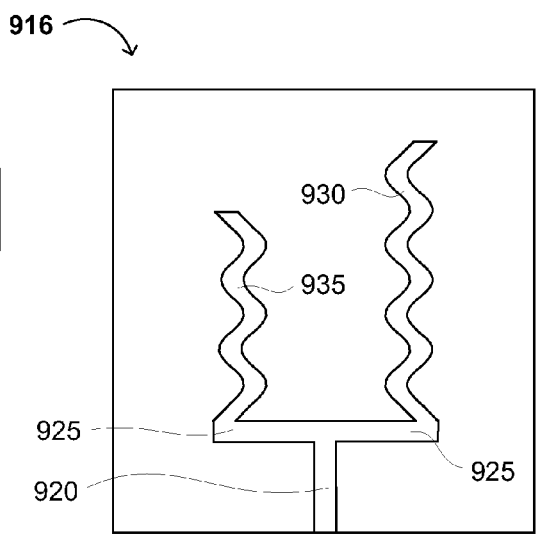
Figure 9C:
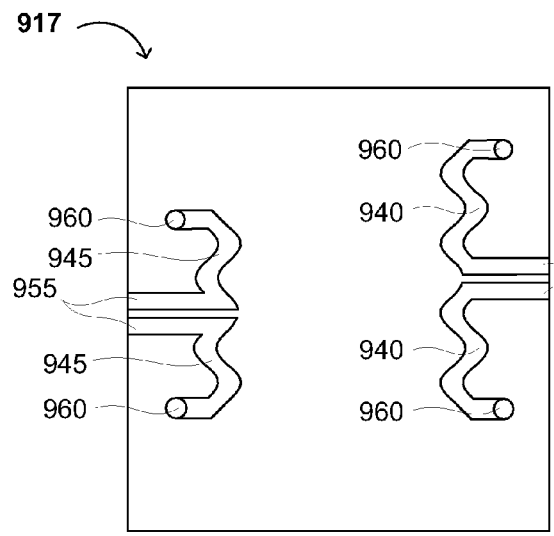
Figure 9D:
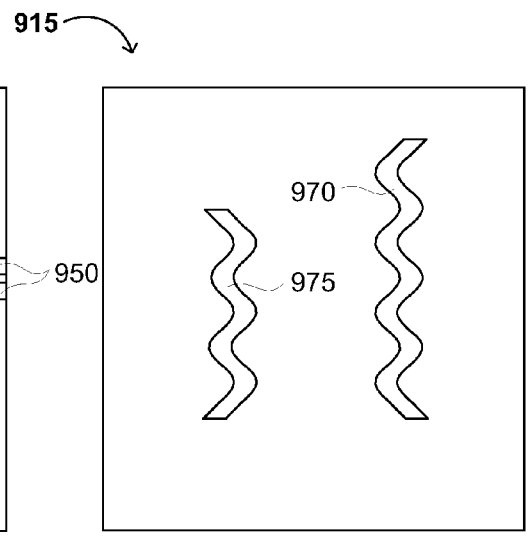

FIGS. 9A-9D illustrate another exemplary implementation of the balanced-unbalanced duplexer 215 shown in FIG. 2. FIGS. 9A-9D are side and layout views of a compact stacked aperture coupling embodiment of the present duplexer. FIG. 9A shows an exemplary side view of a stacked aperture coupling embodiment, which may be formed on a substrate (not shown). The exemplary balanced-unbalanced duplexer 900 comprises a first superstrate 905 having a first surface, on which is formed a first layer (e.g., layer 1), and a second surface, on which is formed a second layer (e.g., layer 2), and second superstrate 910 having a first surface adjoining and/or in contact with layer 2 and a second surface on which is formed a third layer (e.g., layer 3). Ground plane 915 is formed in layer 2 (on one of the surfaces of the first superstrate 905 or second superstrate 910), while conductive unbalanced signal traces 916 are formed in layer 1 and conductive balanced signal traces 917 are formed in layer 3. In embodiments where ground plane 915 (e.g., layer 1) comprises a solid and/or continuous conductive (e.g., metal) film, layer or surface on substantially the entire second surface of first superstrate 905 (or substantially the entire first surface of second superstrate 910), ground plane 915 could interfere with the coupling between corresponding arms in layers 1 and 3. Therefore, as shown in FIG. 9D, apertures 970 and 975 may be formed in ground plane 915 to allow coupling between corresponding structures in layers 1 and 3 which might otherwise interfere with coupling between elements on layers 1 and 3.

FIGS. 9B-9D illustrate exemplary layout views of a stacked aperture coupling embodiment formed in layers 1 and 3 that are coupled to ground plane 915 on layer 2 of first superstrate 905. FIG. 9B shows layer 1, in which are formed unbalanced signal traces 916 including an unbalanced multiband port (e.g., unbalanced single-ended VHF/UHF port) 920, an unbalanced signal branch 925, a first unbalanced coupling arm (e.g., unbalanced single-ended VHF coupling arm) 930, and a second unbalanced coupling arm (e.g., unbalanced single-ended UHF coupling arm) 935.

FIG. 9C shows layer 3, in which are formed balanced signal traces 917 including a first pair of balanced coupling arms (e.g., balanced differential VHF coupling arms) 940, a second pair of balanced coupling arms (e.g., balanced differential UHF coupling arms) 945, a first balanced port (e.g., balanced differential VHF port) 950, and a second balanced port (e.g., balanced differential UHF port) 955. The far ends of each arm in the first and second pairs of balanced coupling arms 940, 945 are conductively coupled to the ground plane 915 through vias 960. In some embodiments, it may be desirable to have the first and second balanced ports 950, 955 in the same layer as the unbalanced port 920, which can be accomplished using vias through the first and second superstrates 905, 910 from layer 3 to layer 1 (not shown).

FIG. 9D shows layer 2, comprising ground plane 915 with first and second apertures 970, 975. First aperture 970 is substantially aligned with the first unbalanced coupling arm 930 in layer 1 and with the first pair of balanced coupling arms 940 in layer 3. Second aperture 975 is substantially aligned with the second unbalanced coupling arm 935 in layer 1 and with the second pair of balanced coupling arms 945 in layer 3. The first and second apertures 970, 975 may be formed in the ground plane 915 by known masking and etching processes.

Relative to the stacked aperture coupling embodiment shown in and discussed with reference to FIGS. 6A-6D, a primary difference in the compact stacked aperture coupling embodiment shown in FIGS. 9A-9D is in the shape and/or length of the compact coupling arms 930, 935, 940 and 945.

Although the first unbalanced coupling arm 930, the first aperture 970 and the first pair of balanced coupling arms 940 are configured compactly in a form that effectively increases the electrical length of the coupling arms and/or reduces one or more dimensions of balanced-unbalanced duplexer 900, they may be positioned in layers 1, 2 and 3, respectively, in alignment with and/or symmetrical, parallel and/or proximate to each other to maximize lateral electromagnetic coupling. Likewise, although the second unbalanced coupling arm 635, second aperture 675 and second pair of balanced coupling arms 645 are configured compactly, they may be positioned on layers 1, 2 and 3, respectively, in alignment with and/or symmetrical, parallel and/or proximate to second unbalanced coupling arm to maximize electrical coupling. The compact configurations of coupling arms 930, 935, 940, 945 and apertures 970, 975 effectively reduce the dimensions of balanced-unbalanced duplexer 900. Alignment tolerances may vary from one embodiment to the next depending on frequency bands, implementations, mediums, etc.

Although not shown in FIGS. 9A-9D, unbalanced signal branch 925 and other traces may also be compacted, e.g., by S-shaped or other configurations. Any conductive trace may be compacted by the above and/or other compaction techniques (such as meandering, folding, winding, spiraling, layering [e.g. spreading over multiple layers]) as long as the resulting electrical characteristics are acceptable.

FIGS. 10A-10E illustrate yet a further exemplary implementation of the balanced-unbalanced duplexer 215 shown in FIG. 2. FIGS. 10A-10E are side and layout views of an ultra compact stacked coupling embodiment of the present duplexer. The ultra compact embodiment shown in and discussed with reference to FIGS. 10A-10E utilizes spiral coupling arms. Although additional layers may be present, spiral coupling arms substantially reduce the dimensions of the balanced-unbalanced duplexer 1000.

Figure 10A:
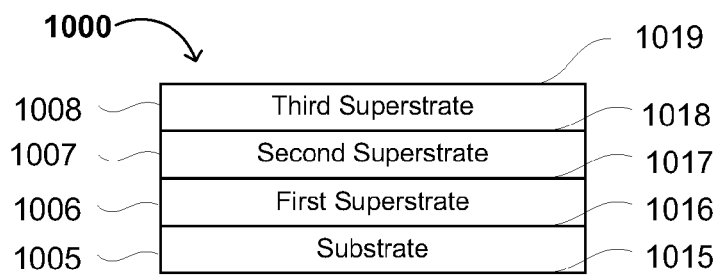
FIGS. 10A-10E are side and layer views of an ultra compact stacked coupling embodiment of the present integrated duplexer.

FIG. 10A shows an exemplary side view of an ultra compact stacked coupling embodiment using spiral coupling arms. The exemplary balanced-unbalanced duplexer 1000 comprises a substrate 1005 having a first surface, on which is formed a first layer (e.g., layer 1), and a second surface, on which may be formed a second layer (e.g., layer 2), a first superstrate 1006 having a first surface adjoining and/or in contact with layer 2 and a second surface on which is formed a third layer (e.g., layer 3), a second superstrate 1007 having a first surface adjoining and/or in contact with layer 3 and a second surface on which is formed a fourth layer (e.g., layer 4), and a third superstrate 1008 having a first surface adjoining and/or in contact with layer 4 and a second surface on which is formed a fifth layer (e.g., layer 5). Ground plane 1015 may be formed in layer 1, while conductive unbalanced signal traces 1016, 1017 are formed in layers 2 and 3, respectively, and conductive balanced signal traces 1018, 1019 are formed in layers 4 and 5, respectively. In some embodiments, the ground plane 1015 (e.g., layer 1) may comprise a solid and/or continuous conductive (e.g., metal) film, layer or surface on substantially the entire first surface of substrate 1005.

Figure 10B:
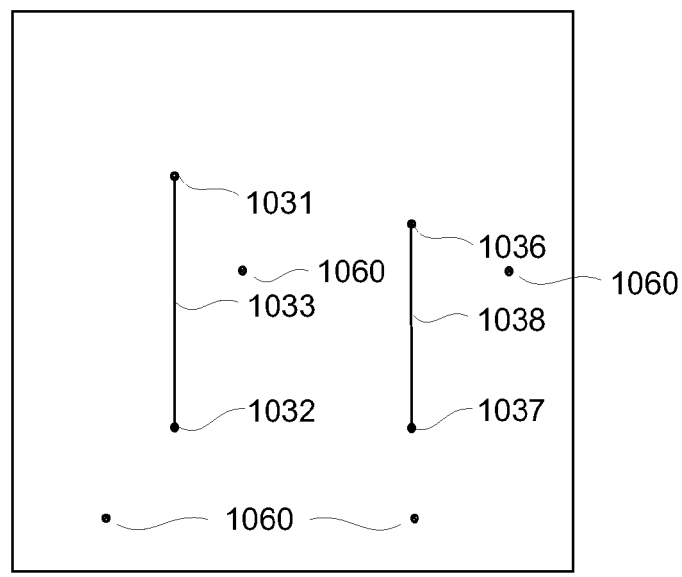
Figure 10C:
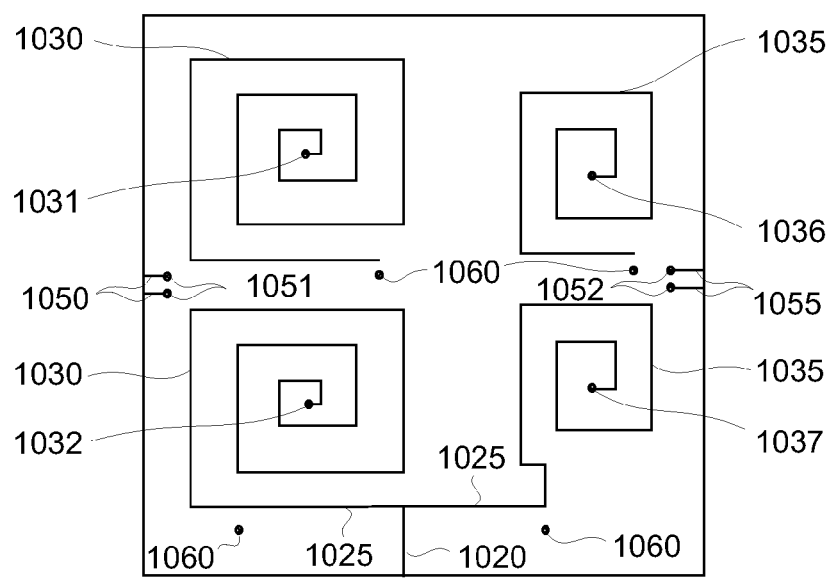

FIGS. 10B-10E illustrate exemplary layout views of an exemplary compact stacked coupling embodiment formed in layers 2-5 that are coupled to ground plane 1015 in layer 1 of substrate 1005. FIGS. 10B-10C show layers 2 and 3, in which are formed unbalanced signal traces 1016, 1017 including an unbalanced multiband port (e.g., unbalanced single-ended VHF/UHF port) 1020, an unbalanced signal branch 1025, a first unbalanced coupling arm (e.g., unbalanced single-ended VHF coupling arm) 1030, and a second unbalanced coupling arm (e.g., unbalanced single-ended UHF coupling arm) 1035. The first and second unbalanced coupling arms 1030, 1035 each include a plurality of spiral-shaped loops, in part to maximize the overlap of unbalanced coupling arms 1030, 1035 with the corresponding balanced coupling arms 1040, 1055 (see FIG. 10D). To minimize any adverse or unpredictable effect(s) from physically connecting the spirals of each unbalanced arm together in the same layer, an additional layer (e.g., layer 2) may be used to electrically connect the spirals of each unbalanced arm to each other. As shown in FIGS. 10B-10C, a first unbalanced conductive segment 1033 in layer 2 is conductively coupled to the centers of first unbalanced coupling arm spirals 1030 through conductive vias 1031, 1032. Similarly, a second unbalanced conductive segment 1038 in layer 2 is conductively coupled to the centers of second unbalanced coupling arm spirals 1035 through conductive vias 1036, 1037.

Figure 10D:
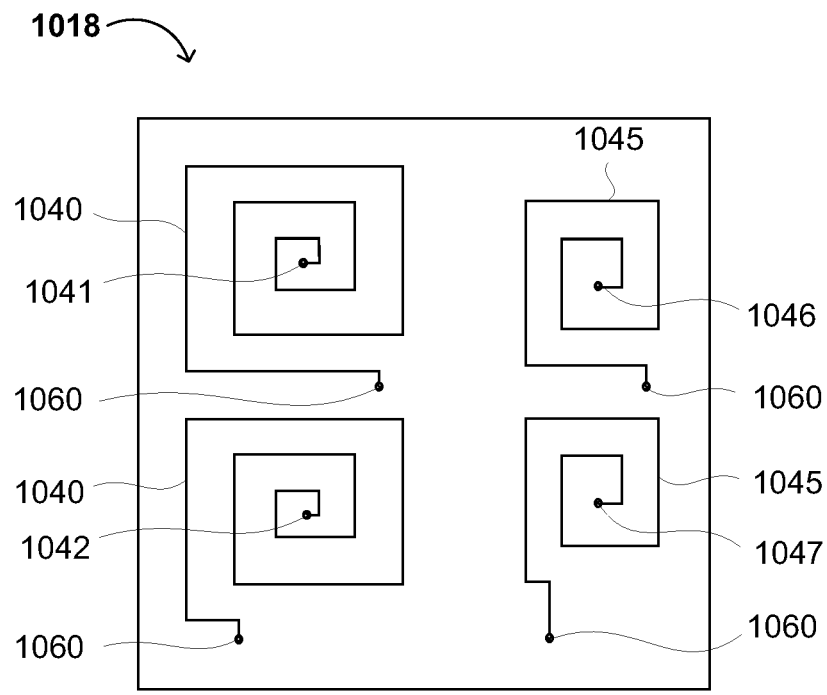
Figure 10E:
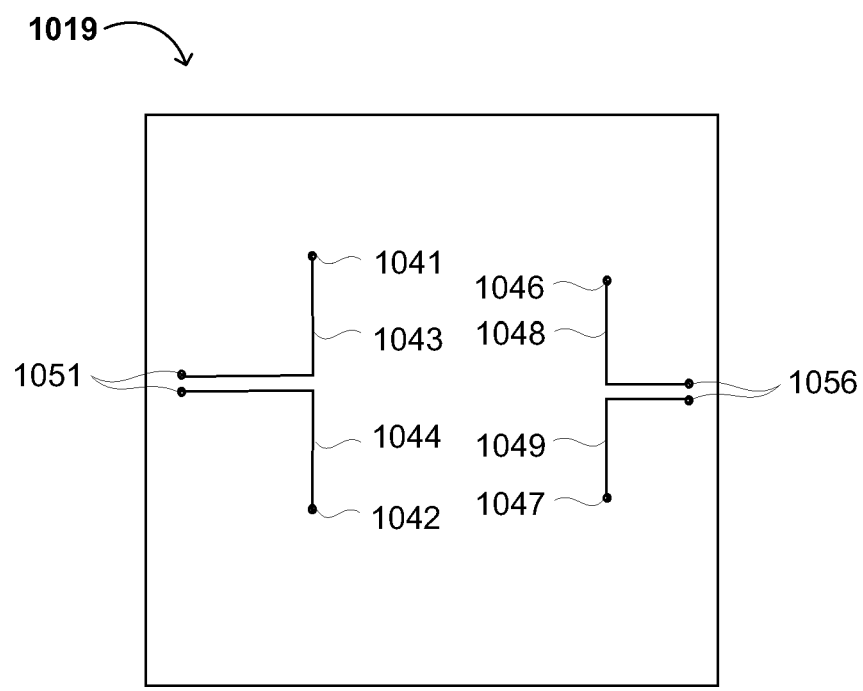

FIGS. 10D-10E show layers 4 and 5, in which are formed balanced signal traces 1018, 1019 including a first pair of balanced coupling arms (e.g., balanced differential VHF coupling arms) 1040, and a second pair of balanced coupling arms (e.g., balanced differential UHF coupling arms) 1045. Referring back to FIG. 10C, the first balanced port (e.g., balanced differential VHF port) 1050 and the second balanced port (e.g., balanced differential UHF port) 1055 are in the same layer 1017 (layer 3; see FIG. 10A) as unbalanced port 1020 (see FIG. 10C), using vias 1051 and 1052 through second and third substrates 1007 and 1008 (see FIG. 10A), connecting signal layers 3 and 5. The far ends of each arm in each of the first and second pairs of balanced coupling arms 1040, 1045 are conductively coupled to the ground plane (layer 1) 1015 through the first and second superstrates 1006 and 1007 (see FIG. 10A) using vias 1060 (see also FIGS. 10B-10C). The first and second pairs of balanced coupling arms 1040, 1045 (see FIG. 10D) each include a plurality of spiral-shaped loops, in part to maximize the overlap of the balanced coupling arms 1040, 1055 with the corresponding unbalanced coupling arms 1030, 1035 (see FIG. 10C). To avoid shorting the spirals of each balanced arm to each other, an additional layer (e.g., layer 5; see FIG. 10E) may be used to electrically connect the spirals of each unbalanced arm to the corresponding port. As shown in FIGS. 10D-10E, first balanced conductive segments 1033, 1034 formed in layer 5 are conductively coupled to the centers of the first pair of balanced coupling arms 1040 through conductive vias 1041, 1042. Similarly, second balanced conductive segments 1048, 1049 formed in layer 5 are conductively coupled to the centers of the second pair of balanced coupling arms 1045 through conductive vias 1046, 1047.

Relative to the balanced-unbalanced stacked coupling duplexer embodiment shown and discussed in FIGS. 5A-5C, primary differences in the embodiment shown in FIGS. 10A-10E include the ultra compact spiral coupling arms and the additional signal layers 2 and 5. First and second unbalanced coupling arms 1030, 1035 and first and second pair of balanced coupling arms 1040, 1045 are configured compactly in a spiral-shaped form. The compact configuration of coupling arms 1030, 1035, 1040, 1045 substantially reduces the dimensions of balanced-unbalanced duplexer 1000. For exemplary comparison, assuming that the electrical wavelengths of first and second unbalanced coupling arms 1030, 1035 correspond to $f_{o(VHF)}$=207 MHz and $f_{o(UHF)}$=630 MHz, respectively, the area of substrate 305 may be approximately 12.90 square centimeters, the area of substrate 705 may be approximately 6.45 square centimeters, and the area of substrate 1005 may be approximately 0.81 square centimeters.

The first pair of balanced coupling arms 1040 may be positioned in layer 4 in alignment with and/or symmetrical, parallel and/or proximate to the first unbalanced coupling arms 1030 in layer 3 to maximize lateral electromagnetic coupling. Likewise, the second pair of balanced coupling arms 1045 may be positioned in layer in alignment with and/or symmetrical, parallel and/or proximate to the second unbalanced coupling arms 1035 in layer 3 to maximize electromagnetic coupling. Alignment tolerances may vary from one embodiment to the next depending on frequency bands, processing implementations, signal transmission media, substrate/superstrate materials and properties, etc.

Although not shown in FIGS. 10A-10E, unbalanced signal branch 1025 and other traces may also be compacted as described herein. Any conductive trace may be compacted as described above and/or by other compaction techniques (such as meandering, folding, winding, spiraling, layering [e.g. spreading over multiple layers]) as long as the resulting electrical characteristics are acceptable.

Although not shown in any of the foregoing exemplary embodiments, in some embodiments, including those not shown herein, the electromagnetic coupling efficiency between unbalanced and balanced coupling arms may be improved by an impedance matching circuit, which may be incorporated into the unbalanced port. Such an impedance matching circuit may comprise, for example, a T-type or π-type circuit. Also, in some embodiments, including those not shown herein, one or more impedance matching stubs may be used in conjunction with the unbalanced signal branch, or elsewhere, in the balanced-unbalanced duplexer to improve the isolation between the unbalanced port and the balanced ports. Various embodiments may have none, one, or more impedance matching stubs.

In some embodiments, including those not shown herein, the unbalanced port and balanced ports may be unidirectional, e.g., for purposes of either transmitting or receiving, while in others they may be bidirectional, e.g., for purposes of reception and transmission. In some embodiments, including those not shown herein, the balanced-unbalanced duplexer may couple, receive and/or transmit two frequency bands, while in others one or more balanced-unbalanced duplexers may couple, receive and/or transmit more than two frequency bands. As previously noted, a frequency band may be either an entire frequency band or merely a portion of a frequency band. Thus, references to multiple (or a plurality of) frequency bands may be to two or more frequencies or frequency ranges within the same band, as well as frequencies or frequency ranges in two distinctive frequency bands. In some embodiments, including those not shown herein, the balanced-unbalanced duplexer may comprise passive components such as conductive traces, in others the balanced-unbalanced duplexer may comprise other passive and/or active components.

In some embodiments, including those not shown herein, the balanced-unbalanced duplexer may comprise passive components such as conductive traces, resistors, capacitors and inductors, while in others, the balanced-unbalanced duplexer may comprise other passive and/or active components. In some embodiments of the invention, including those not shown herein, the balanced-unbalanced duplexer may be a stand-alone discretely packaged component of an RF front end, while in others, the balanced-unbalanced duplexer may be integrated with other components and/or circuitry.

The exemplary embodiments, including those not shown herein, may vary widely while remaining within the scope of this disclosure. The wavelengths, shapes, coupling alignments, dimensions, materials and other design criteria may change from one embodiment to the next. In some embodiments, unbalanced coupling arms and balanced coupling arms may comprise the same or similar geometric shapes, while in other embodiments unbalanced coupling arms and balanced coupling arms may differ. In some stacked aperture coupling embodiments, apertures and coupling arms may comprise the same or similar geometric shapes, while in other embodiments apertures and coupling arms may have different geometric shapes. In some embodiments, conductors that form coupling arms may have uniform shapes, widths and thicknesses, while in other embodiments the shapes may vary, or the widths and/or thicknesses may vary over the lengths of coupling arms. Similarly, in some stacked coupling aperture embodiments, apertures may have uniform (e.g., rectangular) shapes, while in other embodiments, the shapes of the apertures may vary or be nonuniform (e.g., bowtie or other shapes). In some embodiments, the characteristics (e.g., length, width, thickness, material, shape) of the conductive elements may be varied to match predetermined impedances (e.g., a 50 Ohm transmission line impedance).

The various embodiments herein (including those not shown) may be manufactured by a conventional process, including an LTCC (i.e. low temperature co-fired ceramic) process such as Dupont's GREEN TAPE™ LTCC process or other thin-film technology such as Rogers Corporation's DUROID™ laminate process.

Exemplary Apparatuses and Systems

The present duplexer may be implemented in a wide array of apparatuses and systems that communicate using multiple frequency bands. As previously stated, improvements in multi-band radio frequency communications using the present balanced-unbalanced duplexer may improve many technologies. Multi-band radio communication is common to many varieties of audio, video and/or data communication technology, such as television, telephone, radio and data devices having RF receivers and/or transmitters, which may be mobile or fixed, wired or wireless, terrestrial, airborne or satellite, and/or uni-directional or bi-directional. As such, embodiments of the present duplexer may be implemented in the RF front-end of receivers, transmitters and/or transceivers in devices and systems in any of the foregoing technologies or other technologies using multi-band communications.

Embodiments of the present duplexer may be implemented in apparatuses and systems with or without an antenna. An antenna may be characterized as a transducer that converts electromagnetic signals into electrical signals. Embodiments of the present duplexer may operate on electrical signals irrespective of how they were received or transmitted.

Figure 11A:
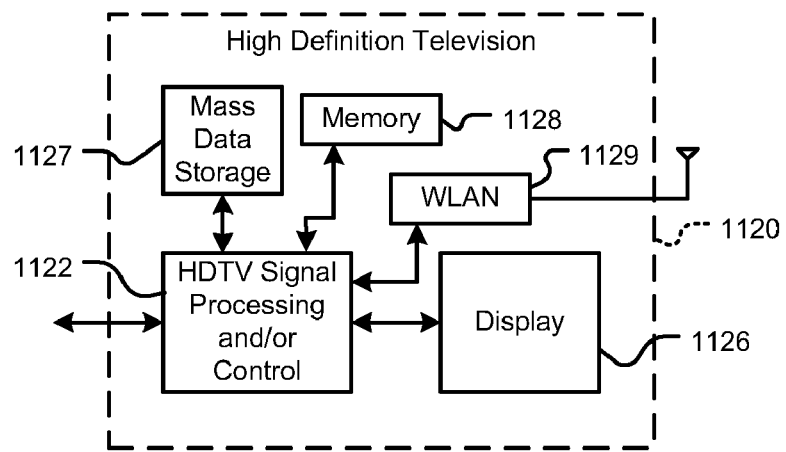
FIG. 11A is a block diagram of a high definition television (HDTV) that can implement an embodiment of the present integrated duplexer.

Various exemplary implementations of the present system are shown in FIGS. 11A-11E. Referring now to FIG. 11A, embodiments of the present duplexer can be implemented in a high definition television (HDTV) 1120. Such embodiments may be implemented in signal processing and/or control circuits, which are generally identified in FIG. 11A at 1122, and/or a WLAN network interface 1129 of the HDTV 1120. The HDTV 1120 receives HDTV input signals in either a wired or wireless format and generates HDTV output signals for a display 1126. In some implementations, signal processing circuit and/or control circuit 1122 and/or other circuits (not shown) of the HDTV 1120 may process data, perform coding and/or encryption, perform calculations, format data and/or perform any other type of HDTV processing that may be required. The HDTV 1120 may communicate with mass data storage 1127 that stores data in a nonvolatile manner such as optical and/or magnetic storage devices. The HDD may be a mini HDD that includes one or more platters having a diameter that is smaller than approximately 1.8". The HDTV 1120 may be connected to memory 1128 such as RAM, ROM, nonvolatile memory such as flash memory and/or other suitable electronic data storage. The HDTV 1120 also may support connections with a WLAN via WLAN network interface 1129.

Figure 11B:
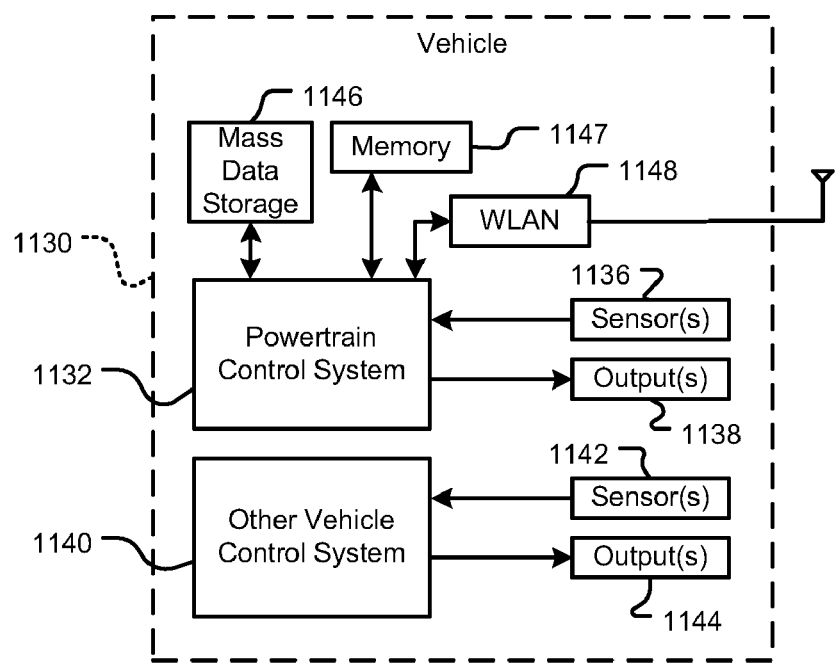
FIG. 11B is a block diagram of a vehicle that can implement an embodiment of the present integrated duplexer.

Referring now to FIG. 11B, embodiments of the present duplexer can be implemented in a control system of a vehicle 1130 and/or a WLAN network interface 1148 of the vehicle 1130. In some implementations, embodiments of the present duplexer can be implemented in a powertrain control system 1132 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals. Embodiments of the present duplexer may also be implemented in other control systems 1140 of the vehicle 1130. The control system 1140 may likewise receive signals from input sensors 1142 and/or output control signals to one or more output devices 1144. In some implementations, the control system 1140 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated. The powertrain control system 1132 may communicate with mass data storage 1146 that stores data in a nonvolatile manner. The mass data storage 1146 may include optical and/or magnetic storage devices (for example, hard disk drives [HDDs] and/or DVD drives). The HDD may be a mini HDD that includes one or more platters having a diameter that is smaller than approximately 1.8". The powertrain control system 1132 may be connected to memory 1147 such as RAM, ROM, nonvolatile memory such as flash memory and/or other suitable electronic data storage. The powertrain control system 1132 also may support connections with a WLAN via WLAN network interface 1148. The control system 1140 may also include mass data storage, memory and/or a WLAN network interface (all not shown).

Figure 11C:
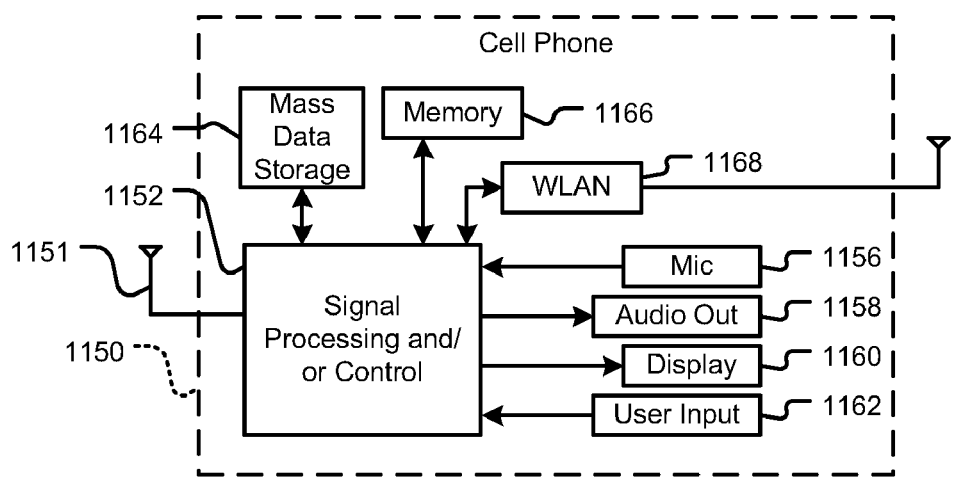
FIG. 11C is a block diagram of a cellular phone that can implement an embodiment of the present integrated duplexer.

Referring now to FIG. 11C, embodiments of the present duplexer can be implemented in a cellular phone 1150 that may include a cellular antenna 1151. Embodiments of the present duplexer can be implemented in signal processing and/or control circuits, which are generally identified in FIG. 11E at 1152, and/or a WLAN network interface 1168 of the cellular phone 1150. In some implementations, the cellular phone 1150 includes a microphone 1156, an audio output 1158 such as a speaker and/or audio output jack, a display 1160 and/or an input device 1162 such as a keypad, pointing device, voice actuation and/or other input device. The signal processing and/or control circuits 1152 and/or other circuits (not shown) in the cellular phone 1150 may process data, perform coding and/or encryption, perform calculations, format data and/or perform other cellular phone functions.

The cellular phone 1150 may communicate with mass data storage 1164 that stores data in a nonvolatile manner such as optical and/or magnetic storage devices (for example, hard disk drives [HDDs] and/or DVD drives). The HDD may be a mini HDD that includes one or more platters having a diameter that is smaller than approximately 1.8". The cellular phone 1150 may be connected to memory 1166 such as RAM, ROM, nonvolatile memory such as flash memory and/or other suitable electronic data storage. The cellular phone 1150 also may support connections with a WLAN via WLAN network interface 1168.

Figure 11D:
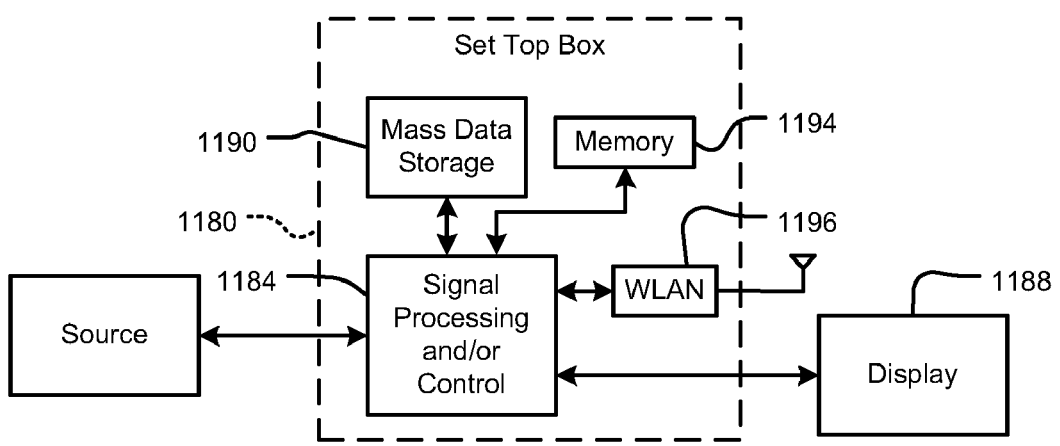
FIG. 11D is a block diagram of a set top box that can implement an embodiment of the present integrated duplexer.

Referring now to FIG. 11D, embodiments of the present duplexer can be implemented in a set top box 1180. Embodiments of the present duplexer can be implemented in signal processing and/or control circuits, which are generally identified in FIG. 11F at 1184, and/or a WLAN network interface 1196 of the set top box 1180. The set top box 1180 receives signals from a source such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

The set top box 1180 may communicate with mass data storage 1190 that stores data in a nonvolatile manner. The mass data storage 1190 may include optical and/or magnetic storage devices (for example, hard disk drives [HDDs] and/or DVD drives). The HDD may be a mini HDD that includes one or more platters having a diameter that is smaller than approximately 1.8". The set top box 1180 may be connected to memory 1194 such as RAM, ROM, nonvolatile memory such as flash memory and/or other suitable electronic data storage. The set top box 1180 also may support connections with a WLAN via WLAN network interface 1196.

Figure 11E:
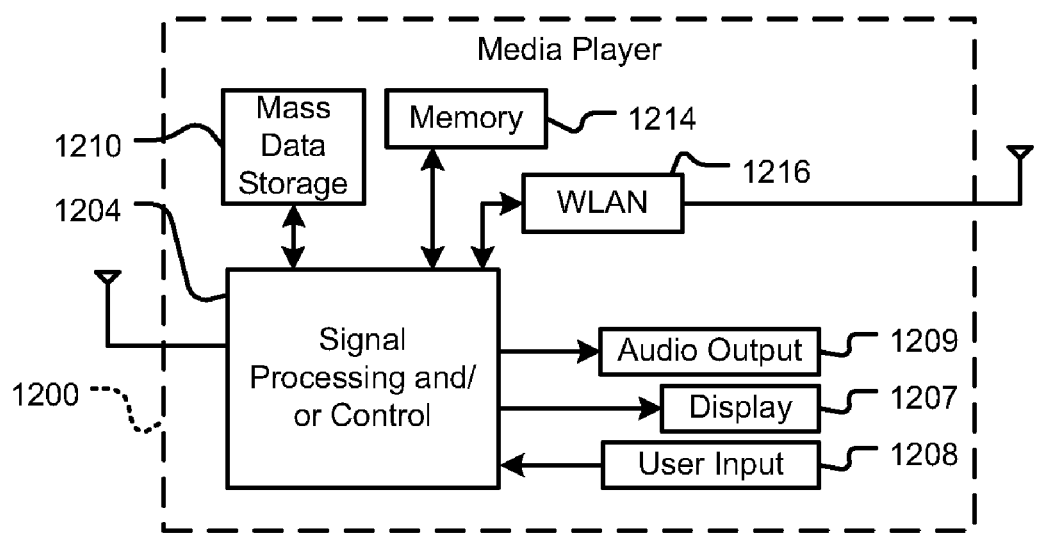
FIG. 11E is a block diagram of a media player that can implement an embodiment of the present integrated duplexer.

Referring now to FIG. 11E, embodiments of the present duplexer can be implemented in a media player 1200. Embodiments of the present duplexer can be implemented in signal processing and/or control circuits, which are generally identified in FIG. 11G at 1204, and/or a WLAN network interface 1216 of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. The media player 1200 further includes an audio output 1209 such as a speaker and/or audio output jack. The signal processing and/or control circuits 1204 and/or other circuits (not shown) of the media player 1200 may process data, perform coding and/or encryption, perform calculations, format data and/or perform any other media player function.

The media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVD drives). The HDD may be a mini HDD that includes one or more platters having a diameter that is smaller than approximately 1.8". The media player 1200 may be connected to memory 1214 such as RAM, ROM, nonvolatile memory such as flash memory and/or other suitable electronic data storage. The media player 1200 also may support connections with a WLAN via WLAN network interface 1216. Still other implementations in addition to those described above are contemplated.

Exemplary Methods

Additional embodiments relate to methods of processing a multiband radio frequency signal or a plurality of single-band signals, generally using the present duplexer or components thereof. The method of processing a multiband radio frequency signal generally relates to receiving and/or separating the multiband signal, and comprises receiving the multiband radio frequency signal in an unbalanced multi-band port; electromagnetically coupling first and second unbalanced coupling arms to first and second pairs of balanced coupling arms, respectively, thereby propagating a first signal of the multiband radio frequency signal onto the first pair of balanced coupling arms and propagating a second signal of the multiband radio frequency signal onto the second pair of balanced coupling arms. In general, the first signal has a first frequency and the second signal has a second frequency different from the first frequency. As described herein, the first and second unbalanced coupling arms are conductively coupled to the unbalanced multi-band port.

The method of processing a plurality of signals generally relates to combining plural single-band signals and/or transmitting the multiband signal, and comprises electromagnetically coupling a first signal having a first frequency on a first pair of balanced coupling arms onto a first unbalanced coupling arm; electromagnetically coupling a second signal having a second frequency on a second pair of balanced coupling arms onto a second unbalanced coupling arm, the first and second unbalanced coupling arms conductively coupled to an unbalanced multi-band port, thereby forming a multiband radio frequency signal at the unbalanced multi-band port; and propagating the multiband radio frequency signal from the unbalanced multi-band port (e.g., to an amplifier and/or antenna).

Various embodiments of the methods may include or involve concepts described elsewhere herein. For example, the first unbalanced coupling arm may have an electrical length of approximately one-half of a wavelength of the first frequency, and the second unbalanced coupling arm may have an electrical length of approximately one-half of a electrical wavelength of the second frequency. Similarly, each of the first pair of balanced coupling arms may have an electrical length that is approximately one-quarter of the wavelength of the first frequency, and each of the second pair of balanced coupling arms may have an electrical length that is approximately one-quarter of the wavelength of the second frequency.

CONCLUSION/SUMMARY

Thus, the present disclosure describes an architecture, circuit, apparatus and system for balanced-unbalanced duplexing of multi-band RF signals. An integrated balanced-unbalanced duplexer for multi-band communications may therefore comprise an unbalanced multi-band port; a first balanced single-band port; a second balanced single-band port; a first unbalanced coupling arm conductively coupled to the unbalanced multi-band port; a second unbalanced coupling arm conductively coupled to the unbalanced multi-band port; a first pair of balanced coupling arms conductively coupled to the first balanced single-band port and electromagnetically coupled to the first unbalanced coupling arm; and a second pair of balanced coupling arms conductively coupled to the second balanced single-band port and electromagnetically coupled to the second unbalanced coupling arm. The architectures and/or systems generally comprise those that include one or more of the multiband duplexer concepts disclosed herein.

The present multiband duplexer advantageously improves the performance and/or signal quality, reduces the dimensions and/or weight, and/or reduces the cost of multi-band RF communication circuitry, apparatuses and systems. These and other advantages of the present multiband duplexer are readily apparent from the foregoing detailed description.

The foregoing descriptions of specific embodiments have been presented for purposes of illustration and description. The specific embodiments are not intended to be exhaustive or to limit the invention to the precise forms disclosed, and many modifications and variations are possible in light of the above teachings. The embodiments were chosen and described in order to best explain certain principles and practical applications, to thereby enable others skilled in the art to best utilize the invention and various embodiments and/or modifications as are suited to the particular use contemplated. It is intended that the scope of the invention be defined by the Claims appended hereto and their equivalents.

What is claimed is:

1. A multi-band duplexer comprising:
   an unbalanced multi-band port;
   a first balanced single-band port;
   a second balanced single-band port;
   a first unbalanced coupling arm conductively coupled to the unbalanced multi-band port;
   a second unbalanced coupling arm conductively coupled to the unbalanced multi-band port;
   an impedance matching circuit;
   a first pair of balanced coupling arms conductively coupled to the first balanced single-band port and electromagnetically coupled to the first unbalanced coupling arm; and
   a second pair of balanced coupling arms conductively coupled to the second balanced single-band port and electromagnetically coupled to the second unbalanced coupling arm, wherein the first and second unbalanced coupling arms are conductively coupled to the unbalanced multi-band port through a conductive unbalanced signal branch, and wherein the conductive unbalanced signal branch is electrically coupled between the unbalanced multi-band port and each of the first and second unbalanced coupling arms.

2. The multi-band duplexer of claim 1, wherein the first unbalanced coupling arm has an electrical length of approximately one-half of an electrical wavelength of a first frequency within a first frequency band, and the second unbalanced coupling arm has an electrical length of approximately one-half of an electrical wavelength of a second frequency within a second frequency band.

3. The multi-band duplexer of claim 2, wherein an electrical length of each of the first pair of balanced coupling arms is approximately one-quarter of the electrical wavelength of the first frequency, and an electrical length of each of the second pair of balanced coupling arms is approximately one-quarter the electrical wavelength of the second frequency.

4. The multi-band duplexer of claim 1, further comprising:
   a third balanced single-band port;
   a third unbalanced coupling arm conductively coupled to the unbalanced multi-band port; and
   a third pair of balanced coupling arms conductively coupled to the third balanced single-band port and electromagnetically coupled to the third unbalanced coupling arm.

5. The multi-band duplexer of claim 1, wherein each of the unbalanced multi-band port and the first and second balanced single-band ports are bidirectional.

6. The multi-band duplexer of claim 1, wherein each of the first pair of balanced coupling arms is aligned with the first unbalanced coupling arm, and each of the second pair of balanced coupling arms is aligned with the second unbalanced coupling arm.

7. The multi-band duplexer of claim 1, wherein each of the first and second pairs of balanced coupling arms is conductively coupled to a ground potential.

8. The multi-band duplexer of claim 1, wherein the first and second unbalanced coupling arms and the first and second pairs of balanced coupling arms comprise one or more layers of conductive traces.

9. The multi-band duplexer of claim 8, wherein the first unbalanced coupling arm is in a first layer of conductive traces, and the first pair of balanced coupling arms are in a second layer of conductive traces.

10. The multi-band duplexer of claim 9, further comprising a ground plane between the first and second layers, the ground plane comprising a plurality of apertures aligned with the first unbalanced coupling arm and the first pair of balanced coupling arms.

11. The multi-band duplexer of claim 9, wherein the first and second layers of conductive traces are separated by a substrate or a superstrate.

12. The multi-band duplexer of claim 1, wherein each of the first and second unbalanced coupling arms and the first and second pair of balanced coupling arms substantially have a same shape.

13. The multi-band duplexer of claim 12, wherein the shape of the first and second unbalanced coupling arms and the first and second pair of balanced coupling arms is rectangular, S-shaped, or spiral.

14. The multi-band duplexer of claim 1, further comprising an amplifier configured to amplify a multiband radio frequency signal and provide an amplified multiband radio frequency signal to the unbalanced multi-band port.

15. The multi-band duplexer of claim 14, further comprising an antenna configured to receive said multiband radio frequency signal.

16. A radio frequency communications apparatus comprising the integrated balanced-unbalanced duplexer of claim 1.

17. The radio frequency communications apparatus of claim 16, wherein the apparatus comprises a cellular telephone, a wireless networking device, a television receiver, or a radio receiver.

18. A multi-band duplexer, comprising;
an unbalanced multi-band port;
a first balanced single-band port;
a second balanced single-band port;
a first unbalanced coupling arm conductively coupled to the unbalanced multi-band port;
a second unbalanced coupling arm conductively coupled to the unbalanced multi-band port;
an impedance matching stub conductively coupled to the unbalanced multi-band port;
a first pair of balanced coupling arms conductively coupled to the first balanced single-band port and electromagnetically coupled to the first unbalanced coupling arm; and
a second pair of balanced coupling arms conductively coupled to the second balanced single-band port and electromagnetically coupled to the second unbalanced coupling arm, wherein the first and second unbalanced coupling arms are conductively coupled to the unbalanced multi-band port through a conductive unbalanced signal branch, and wherein the conductive unbalanced signal branch is electrically coupled between the unbalanced multi-band port and each of the first and second unbalanced coupling arms.

19. The multi-band duplexer of claim 18, wherein the impedance matching circuit is conductively coupled to the unbalanced multi-band port, the first balanced single-band port, and/or the second balanced single-band port.

20. A multi-band duplexer, comprising:
an unbalanced multi-band port;
a first balanced single-band port;
a second balanced single-band port;
a first unbalanced coupling arm conductively coupled to the unbalanced multi-band port;
a second unbalanced coupling arm conductively coupled to the unbalanced multi-band port;
a first pair of balanced coupling arms conductively coupled to the first balanced single-band port and electromagnetically coupled to the first unbalanced coupling arm, wherein the first unbalanced coupling arm and the first pair of balanced coupling arms are in a single layer of conductive traces; and
a second pair of balanced coupling arms conductively coupled to the second balanced single-band port and electromagnetically coupled to the second unbalanced coupling arm, wherein the first and second unbalanced coupling arms are conductively coupled to the unbalanced multi-band port through a conductive unbalanced signal branch, and wherein the conductive unbalanced signal branch is electrically coupled between the unbalanced multi-band port and each of the first and second unbalanced coupling arms.

21. The multi-band duplexer of claim 20, further comprising an impedance matching circuit.

22. The multi-band duplexer of claim 21, wherein the impedance matching circuit is conductively coupled to the unbalanced multi-band port, the first balanced single-band port, and/or the second balanced single-band port.

23. A method of processing a multiband radio frequency signal, the method comprising:
receiving the multiband radio frequency signal in an unbalanced multi-band port, the unbalanced multi-band port including an impedance matching circuit;
electromagnetically coupling first and second unbalanced coupling arms conductively coupled to the unbalanced multi-band port to first and second pairs of balanced coupling arms, respectively, thereby propagating a first signal of the multiband radio frequency signal onto the first pair of balanced coupling arms and propagating a second signal of the multiband radio frequency signal onto the second pair of balanced coupling arms, the first signal having a first frequency and the second signal having a second frequency,
wherein the first and second unbalanced coupling arms are conductively coupled to the unbalanced multi-band port through a conductive unbalanced signal branch, and
wherein the conductive unbalanced signal branch is electrically coupled between the unbalanced multi-band port and each of the first and second unbalanced coupling arms.

24. The method of claim 23, wherein the first unbalanced coupling arm has an electrical length of approximately one-half of a wavelength of the first frequency, and the second unbalanced coupling arm has an electrical length of approximately one-half of a electrical wavelength of the second frequency.

25. The method of claim 24, wherein each of the first pair of balanced coupling arms has an electrical length that is approximately one-quarter of the wavelength of the first frequency, and each of the second pair of balanced coupling arms has an electrical length that is approximately one-quarter of the wavelength of the second frequency.

26. A method of processing a plurality of signals, the method comprising:
electromagnetically coupling a first signal having a first frequency on a first pair of balanced coupling arms onto a first unbalanced coupling arm;
electromagnetically coupling a second signal having a second frequency on a second pair of balanced coupling arms onto a second unbalanced coupling arm, the first and second unbalanced coupling arms conductively coupled to an unbalanced multi-band port, thereby forming a multiband radio frequency signal at the unbalanced multi-band port, wherein the first and second unbalanced coupling arms are conductively coupled to the unbalanced multi-band port through a conductive unbalanced signal branch, the conductive unbalanced signal branch is electrically coupled between the unbalanced multi-band port and each of the first and second unbalanced coupling arms, and the unbalanced multi-band port includes an impedance matching circuit; and propagating the multiband radio frequency signal from the unbalanced multi-band port.

27. The method of claim 26, wherein the first unbalanced coupling arm has an electrical length of approximately one-half of a wavelength of the first frequency, and the second unbalanced coupling arm has an electrical length of approximately one-half of a electrical wavelength of the second frequency.

28. The method of claim 27, wherein each of the first pair of balanced coupling arms has an electrical length that is approximately one-quarter of the wavelength of the first frequency, and each of the second pair of balanced coupling arms has an electrical length that is approximately one-quarter of the wavelength of the second frequency.

* * * * *